(12) United States Patent
Nakanishi

(10) Patent No.: US 9,547,566 B2
(45) Date of Patent: Jan. 17, 2017

(54) STORAGE CONTROL APPARATUS, STORAGE APPARATUS, INFORMATION PROCESSING SYSTEM, AND STORAGE CONTROL METHOD THEREFOR

(71) Applicant: Sony Corporation, Tokyo (JP)

(72) Inventor: Kenichi Nakanishi, Tokyo (JP)

(73) Assignee: Sony Corporation, Tokyo (JP)

( * ) Notice: Subject to any disclaimer, the term of this patent is extended or adjusted under 35 U.S.C. 154(b) by 133 days.

(21) Appl. No.: 14/487,729

(22) Filed: Sep. 16, 2014

(65) Prior Publication Data

US 2015/0113311 A1  Apr. 23, 2015

(30) Foreign Application Priority Data

Oct. 18, 2013  (JP) ................................. 2013-216912

(51) Int. Cl.
| | |
|---|---|
| *G06F 11/00* | (2006.01) |
| *G06F 11/20* | (2006.01) |
| *G11C 11/00* | (2006.01) |
| *G06F 11/10* | (2006.01) |

(52) U.S. Cl.
CPC ....... *G06F 11/2028* (2013.01); *G06F 11/1008* (2013.01); *G06F 11/1012* (2013.01); *G11C 11/00* (2013.01)

(58) Field of Classification Search
CPC .............. G06F 11/0727; G06F 11/0793; G06F 11/2028; G11C 11/406
See application file for complete search history.

(56) References Cited

U.S. PATENT DOCUMENTS

| | | | | | |
|---|---|---|---|---|---|
| 5,901,159 | A | * | 5/1999 | Ichikawa | ........... G11B 20/1806 386/E9.052 |
| 6,018,817 | A | * | 1/2000 | Chen | ................... G06F 11/1012 714/718 |
| 7,020,810 | B2 | * | 3/2006 | Holman | ................ H03M 13/03 714/52 |
| 7,039,753 | B2 | * | 5/2006 | Suzuki | ...................... G06F 3/08 711/102 |

(Continued)

FOREIGN PATENT DOCUMENTS

JP  2011-081776  4/2011

*Primary Examiner* — Esaw Abraham
(74) *Attorney, Agent, or Firm* — Michael Best & Friedrich LLP

(57) ABSTRACT

A storage control apparatus includes an uncorrectable error generation flag management section configured to manage an uncorrectable error generation flag in a memory configured to store a first error detection and correction code corresponding to a first data unit, and a second error detection and correction code corresponding to a second data unit including first data units, the uncorrectable error generation flag representing whether or not an uncorrectable error with the first code has occurred, the uncorrectable error generation flag being managed for each second data unit, a controller configured to prohibit access to the second data unit representing that the uncorrectable error has occurred when a command for the access with data change is issued, and a correction section configured to use the second code to correct the second data unit when the second data unit representing that the uncorrectable error has occurred is restored.

18 Claims, 19 Drawing Sheets

(56) References Cited

U.S. PATENT DOCUMENTS

| | | | | |
|---|---|---|---|---|
| 7,222,270 B2* | 5/2007 | Meaney | ............... | G06F 11/0772 |
| | | | | 714/41 |
| 7,424,648 B2* | 9/2008 | Honda | ................ | G06F 11/1068 |
| | | | | 714/52 |
| 7,437,593 B2* | 10/2008 | Johnson | .............. | G06F 11/1008 |
| | | | | 370/463 |
| 8,001,447 B2* | 8/2011 | Katoh | ................ | G11B 20/1833 |
| | | | | 714/756 |
| 8,478,796 B2* | 7/2013 | Post | .................... | G06F 12/0246 |
| | | | | 707/813 |
| 8,484,542 B2* | 7/2013 | d'Abreu | ................. | G06F 11/10 |
| | | | | 714/763 |
| 8,650,458 B2* | 2/2014 | Kim | .................... | G06F 11/1068 |
| | | | | 714/758 |
| 8,806,112 B2* | 8/2014 | Somanache | ......... | G06F 12/0246 |
| | | | | 711/103 |

* cited by examiner

STORAGE CONTROL APPARATUS, STORAGE APPARATUS, INFORMATION PROCESSING SYSTEM, AND STORAGE CONTROL METHOD THEREFOR

CROSS REFERENCE TO RELATED APPLICATIONS

This application claims the benefit of Japanese Priority Patent Application JP 2013-216912 filed Oct. 18, 2013, the entire contents of which are incorporated herein by reference.

BACKGROUND

The present disclosure relates to a storage control apparatus, a storage apparatus, and an information processing system that correct error detection and correction in a memory, a processing method therein, and a program that causes a computer to execute the processing method.

In a storage apparatus including a non-volatile memory and a memory controller that controls the non-volatile memory, the memory controller generates, for each writing unit, an error detection and correction code (ECC) with respect to data input to improve the properties for storing data. On the memory, data and ECC parity is stored in relation to each other. When the data is read, also the ECC parity is read together with the data. The data on which a bit error detection process and a bit error correction process are performed is output. The properties for storing data of a cell of a non-volatile memory are deteriorated as the number of writing times increases. Therefore, using an ECC with higher correction capabilities results in enhancement of the reliability. On the other hand, because the size of parity for protecting the same wiring unit increases if the correction capabilities are high, it needs to expand capacity for storing ECC parity, resulting in increase in cost.

In view of the above, it has been proposed to improve the reliability of data by preparing a second ECC with high correction capabilities for protecting a plurality of writing units in addition to a first ECC for protecting a predetermined writing unit in the past (see, for example, Japanese Patent Application Laid-open No. 2011-081776).

SUMMARY

In the related art, by preparing the second ECC in addition to the first ECC, it is possible to use the second ECC to perform error correction in the case where an error that is hard to correct with the first ECC has occurred. Therefore, it is possible to improve the reliability of data. However, because the size of data targeted by the second ECC is larger than the data targeted by the first ECC, it often needs to make the second ECC invalid or reproduce the second ECC by writing new data. At this time, in the case where data that is hard to correct with the first ECC is included, opportunities for correcting the data are lost if the second ECC is made invalid as it is. On the other hand, if a process of generating the second ECC after the data is corrected with the second ECC is performed for each time, memory-accessing properties may be affected because the process takes relatively long time.

The present disclosure has been made in view of the above circumstances, and it is desirable to perform correction with the second ECC at arbitrary timing when data that is hard to correct is generated.

According to a first embodiment of the present disclosure, there is provided a storage control apparatus and a storage control method therefor, the storage control apparatus including an uncorrectable error generation flag management section configured to manage an uncorrectable error generation flag in a memory configured to store a first error detection and correction code corresponding to a first data unit, and a second error detection and correction code corresponding to a second data unit including a plurality of first data units, the uncorrectable error generation flag representing whether or not an error that is hard to correct with the first error detection and correction code has occurred, the uncorrectable error generation flag being managed for each second data unit, a controller configured to prohibit access to the second data unit representing that the error that is hard to correct with the first error detection and correction code has occurred in a case where a command for the access with data change is issued, and a correction section configured to use the second error detection and correction code to correct the second data unit in a case where the second data unit representing that the error that is hard to correct with the first error detection and correction code has occurred is restored. Accordingly, it provides an operation in which timing when an error that is hard to correct with the first error detection and correction code is corrected with the second error detection and correction code is made flexible. It should be noted that the second data unit may further include additional information corresponding to each of the plurality of first data units.

In the first embodiment, the controller may be configured to notify a source of a command for write access to the second data unit representing that the error that is hard to correct with the first error detection and correction code has occurred of that write access is prohibited in a case where the command for write access is issued. Accordingly, it provides an operation in which the correction with the second error detection and correction code is encouraged.

In the first embodiment, the storage control apparatus may further include a second error detection and correction code valid flag management section configured to manage a second error detection and correction code valid flag that represents whether or not the second error detection and correction code is valid for each second data unit, the controller being configured to notify, based on the second error detection and correction code valid flag, a source of a command for read access to the second data unit in which the error that is hard to correct with the first error detection and correction code has occurred in a case where the command for read access is issued. Accordingly, it provides an operation in which the source of a command is notified of whether or not the correction with the second error detection and correction code is possible.

In the first embodiment, the controller may be configured to notify a source of a command for removing the second error detection and correction code of that removal of the second error detection and correction code is prohibited in a case where the command for removing is issued with respect to the second data unit representing that the error that is hard to correct with the first error detection and correction code has occurred. Accordingly, it provides an operation in which room for correction is ensured.

In the first embodiment, the storage control apparatus may further include a temporary alternative area valid flag management section configured to manage, for each second data unit, a temporary alternative area valid flag that represents whether or not there is a temporary alternative area corresponding to at least a part of the second data unit, the controller being configured to perform write access to the temporary alternative area in a case where a command for write access is issued with respect to an area in which the temporary alternative area exists, and to perform read access to the temporary alternative area in a case where a command for read access is issued with respect to the area in which the temporary alternative area exists. Accordingly, it provided an operation in which the use of the second error detection and correction code is maintained.

In the first embodiment, the controller may be configured to reflect memory content of the temporary alternative area on the memory to regenerate the first error detection and correction code and the second error detection and correction code in a case where a command for eliminating the temporary alternative area is issued. Accordingly, it provides an operation in which the temporary alternative area is eliminated, and the first error detection and correction code and the second error detection and correction code is regenerated.

In the first embodiment, the controller may be configured to use, when a system is shutdown, the second error detection and correction code to restore the second data unit representing that the error that is hard to correct with the first error detection and correction code has occurred. Accordingly, it provides an operation in which protection of data to prepare for the case where there is some time until the system is activated next time is increased.

According to a second embodiment of the present disclosure, there is provided a storage apparatus, including a memory configured to store a first error detection and correction code corresponding to a first data unit, and a second error detection and correction code corresponding to a second data unit including a plurality of first data units, an uncorrectable error generation flag management section configured to manage an uncorrectable error generation flag in the memory, the uncorrectable error generation flag representing whether or not an error that is hard to correct with the first error detection and correction code has occurred, the uncorrectable error generation flag being managed for each second data unit, a controller configured to prohibit access to the second data unit representing that the error that is hard to correct with the first error detection and correction code has occurred in a case where a command for the access with data change is issued, and a correction section configured to use the second error detection and correction code to correct the second data unit in a case where the second data unit representing that the error that is hard to correct with the first error detection and correction code has occurred is restored. Accordingly, it provides an operation in which timing when an error that is hard to correct with the first error detection and correction code in the memory is corrected with the second error detection and correction code is made flexible.

According to a third embodiment of the present disclosure, there is provided an information processing system, including a memory configured to store a first error detection and correction code corresponding to a first data unit, and a second error detection and correction code corresponding to a second data unit including a plurality of first data units, a host computer configured to issue a command for access to the memory, an uncorrectable error generation flag management section configured to manage an uncorrectable error generation flag in the memory, the uncorrectable error generation flag representing whether or not an error that is hard to correct with the first error detection and correction code has occurred, the uncorrectable error generation flag being managed for each second data unit, a controller configured to prohibit access to the second data unit representing that the error that is hard to correct with the first error detection and correction code has occurred in a case where a command for the access with data change is generated, and a correction section configured to use the second error detection and correction code to correct the second data unit in a case where the second data unit representing that the error that is hard to correct with the first error detection and correction code has occurred is restored. Accordingly, it provides an operation in which the host computer flexibly issues a command for timing when an error that is hard to correct with the first error detection and correction code and is generated in the memory is corrected with the second error detection and correction code is made flexible.

According to the present disclosure, it is possible to achieve such excellent effects that data that is hard to correct with the first ECC is generated can be corrected with the second ECC at arbitrary timing.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments for carrying out the present disclosure (below, referred to as an embodiment) will be described with reference to the drawings. The description will be made in the following order.
1. First embodiment (access control with uncorrectable error generation flag)
2. Second embodiment (access control in combination with temporary alternative areas)

1. First Embodiment (Configuration of Information Processing System)

Figure 1:
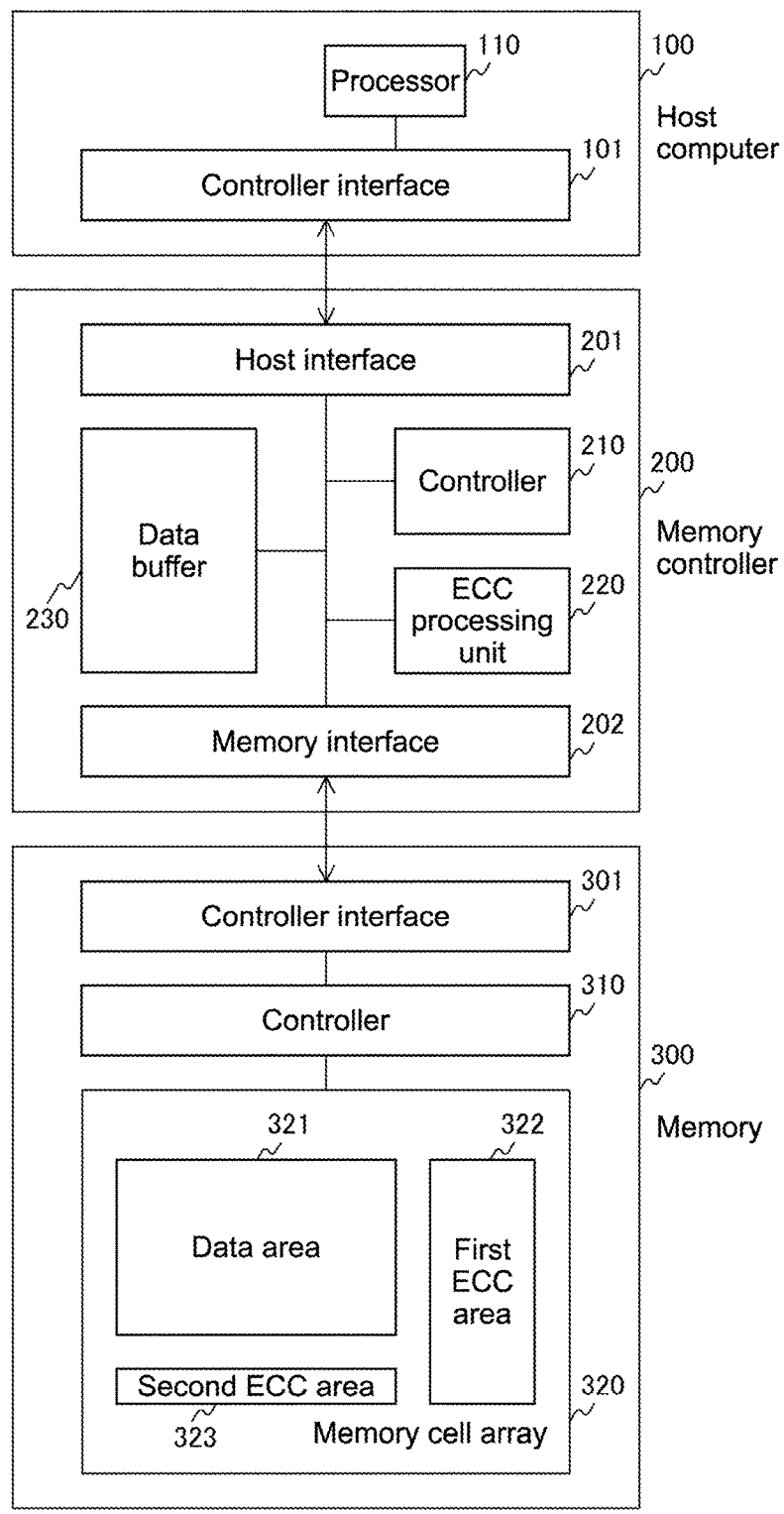
FIG. 1 is a diagram showing a configuration example of an information processing system according to a first embodiment of the present disclosure.

FIG. 1 is a diagram showing a configuration example of an information processing system according to a first embodiment of the present disclosure. The information processing system includes a host computer 100, a memory controller 200, and a memory 300. The memory controller 200 and the memory 300 constitute a storage system.

The host computer 100 issues commands such as reading and writing processes of data with respect to the memory 300 and a process related to error correction. The host computer 100 includes a processor 110 and a controller interface 101. The processor 110 performs a process as the host computer 100, and the controller interface 101 interacts with the memory controller 200.

The memory controller 200 performs request control with respect to the memory 300 in accordance with a command from the host computer 100. The memory controller 200 includes a controller 210, an ECC processing unit 220, a data buffer 230, a host interface 201, and a memory interface 202.

The controller 210 performs the entire control of the memory controller 200. The controller 210 interprets a command issued from the host computer 100, and demands a necessary request to the memory 300. In this example, examples of a command from the host computer 100 includes a second ECC setting command, a reading command, a writing command, a second ECC removing command, an activation command, and a shut-down command.

The ECC processing unit 220 generates an ECC of data stored in the memory 300, and performs error detection and correction processes of data read from the memory 300. As will be described later, in this embodiment, two types of ECCs, i.e., a first ECC and a second ECC are assumed to be an error detection and correction code. It should be noted that the ECC processing unit 220 is an example of the correction section described in claims.

The data buffer 230 is a buffer for temporarily storing writing data received from the host computer 100, reading data received from the memory 300, or the like when transferring the data.

The host interface 201 is an interface for interacting with the host computer 100. The memory interface 202 is an interface for interacting with the memory 300.

The memory 300 includes a controller 310, the memory cell array 320, and a controller interface 301. The controller 310 performs the entire control of the memory 300, and controls access to the memory cell array 320 in accordance with a request received from the memory controller 200. The controller interface 301 is an interface for interacting with the memory controller 200.

The memory cell array 320 is a memory cell array including a plurality of memory cells. In the memory cell array 320, the plurality of memory cells that store any one of two values for each bit are arranged two-dimensionally (in a matrix pattern). The memory cell array 320 is assumed to be a non-volatile memory (NVM). Examples of the non-volatile memory are classified roughly into a flash memory and a non-volatile random access memory (NVRAM). The flash memory supports data access in a large size unit, and the NVRAM is able to perform random access at a high speed in a small unit. It should be noted that typical examples of the flash memory include a NAND flash memory. On the other hand, examples of the NVRAM include a resistance RAM (ReRAM), a phase-change RAM (PC RAM), and a magnetoresistive RAM (MRAM).

Each memory cell of the memory cell array 320 includes a data area 321, a first ECC area 322, and the second ECC area 323. The data area 321 is an area for storing normal data. The data area 321 is segmented into first data units as will be described later.

The first ECC area 322 is an area for storing a first ECC corresponding to the first data unit. The second ECC area 323 is an area for storing a second ECC corresponding to a second data unit including a plurality of first data units.

When writing data to the memory cell array 320, the memory controller 200 transmits data added with first ECC parity to the memory 300. The data and first ECC parity are written to the memory 300 simultaneously. When reading the data, the data and first ECC parity are read simultaneously. The memory controller 200 performs an error detection and correction process with the first ECC on the read data, and transmits the processed data from the data buffer 230 to the host computer 100. When receiving a command for setting the second ECC from the host computer 100, the memory controller 200 reads a data area including a plurality of first data units being a target. At this time, the memory controller 200 performs an error detection and correction process with the first ECC by the ECC processing unit 220. Then, the memory controller 200 sequentially inputs data in which all errors are corrected to the ECC processing unit 220, and writes second ECC parity generated by inputting data in a plurality of first data units to a part of the second ECC area 323. At this time, it is favorable that the second ECC area 323 that stores the second ECC parity is also protected with the first ECC to store flag information other than the second ECC parity.

(Storing Format of Memory Cell Array)

Figure 2:
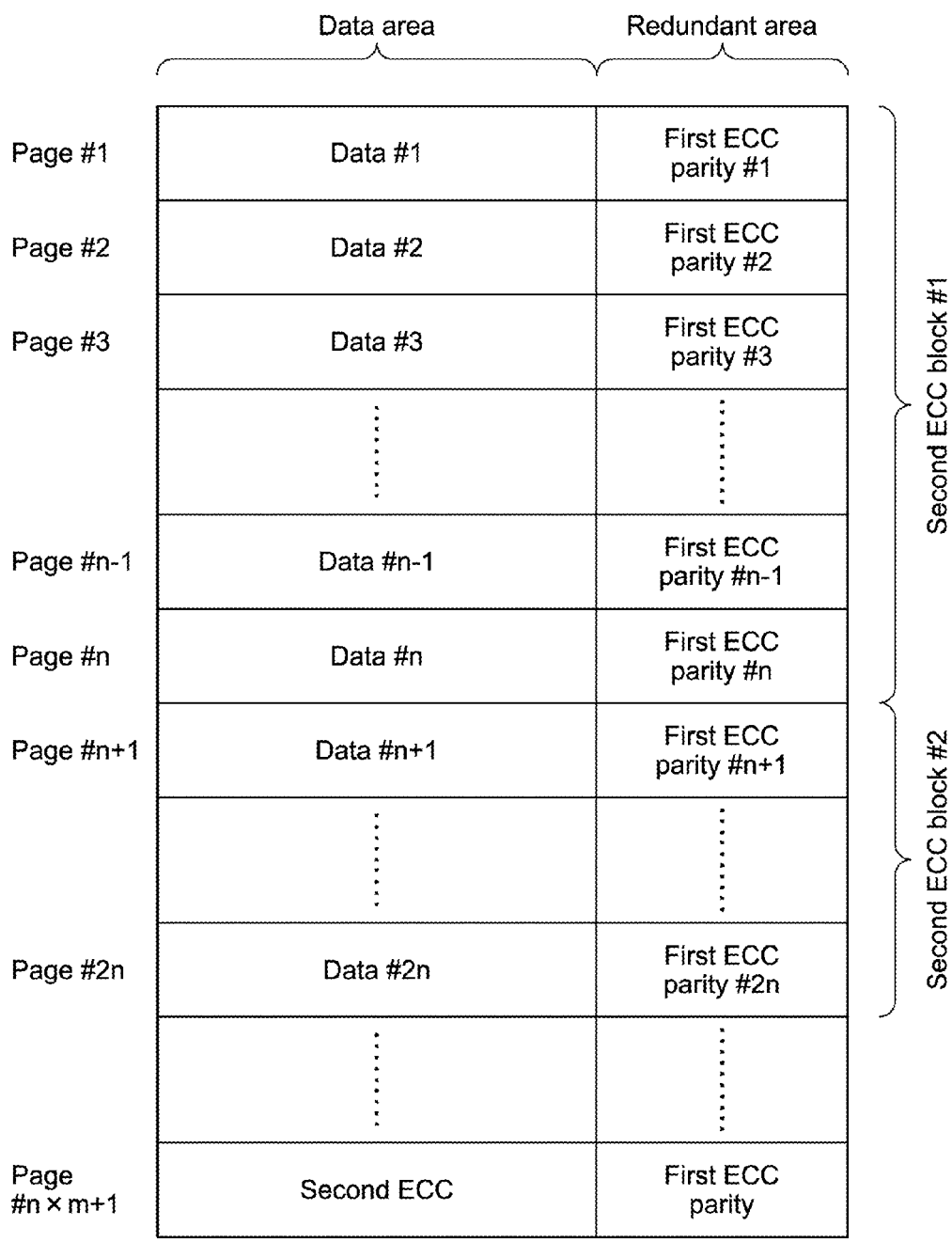
FIG. 2 is a diagram showing an example of a storage format of a memory cell array 320 according to an embodiment of the present disclosure.

FIG. 2 is a diagram showing an example of a storage format of the memory cell array 320 according to an embodiment of the present disclosure. Here, second ECC blocks including n pages are shown. The page represents a physical writing unit. The second ECC block stores data in the first data unit to be a target of the first ECC in a data area, and stores the first ECC parity in a redundant area. In each page, the data and first ECC parity are stored in relation to each other on a one-to-one basis. Moreover, in the (n*m+1)-th page, as a page for storing the second ECC, the second ECC parity for m second ECC blocks and the first ECC parity protecting them are stored in relation to each other.

Figure 3:
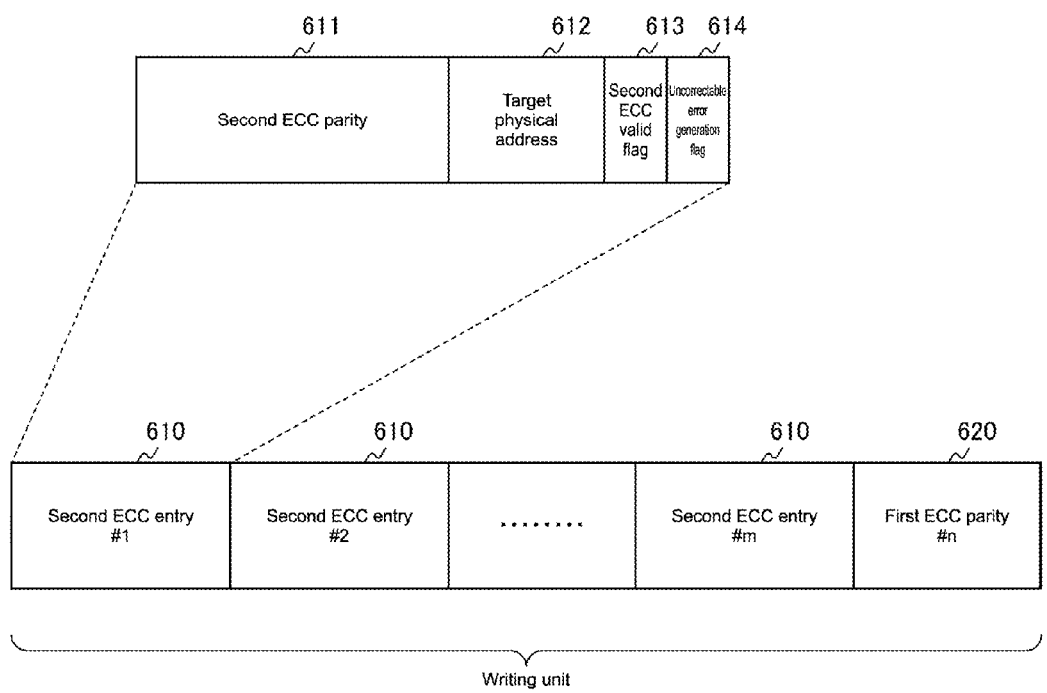
FIG. 3 is a diagram showing an example of a storage format of a second ECC area 323 of the memory cell array 320 according to the first embodiment of the present disclosure.

An error detection and correction code corresponding to the second data unit for data #1 to #n in the first to n-th pages constituting the second ECC block #1 is referred to as a second ECC entry #1 (see, FIG. 3). The same shall apply to a second ECC entry #2 and subsequent second ECC entries. Because the second data unit collectively includes a plurality of first data units, the size of the second data unit is larger than that of the first data unit. It should be noted that although the second data unit collectively includes only a plurality of first data units in this example, the second data unit may include a plurality of pieces of additional information such as the first ECC parity corresponding to the first data unit.

Here, as a specific embodiment, it is assumed that 512 bytes is one sector, the first ECC protects data of one sector size, and the second ECC protects consecutive data of eight sectors size (4K bytes). The parity size in the case where 2-bit correction for the first ECC is possible is 26 bits. In this case, the bit error rate (BER) before correction is $10^{-6}$, and the BER after correction is about $10^{-11}$. On the other hand, the parity size in the case where 5-bit correction for the second ECC is possible is 80 bits. In this case, the BER before correction is $10^{-6}$, and the BER after correction is about $10^{-15}$. Therefore, the BER is improved as compared with the case of the above-mentioned first ECC. It should be noted that there is a need of 6-bit correction in a sector unit to achieve the BER equivalent to that of the second ECC only with the first ECC. In this case, the parity size of the first ECC is 78 bits. Specifically, because the parity size is 624 bits for 8 sectors, there is a need of capacity that is at least seven times larger than the above-mentioned parity size of the second ECC. Therefore, it turns out to be possible to reduce the parity size by providing the second ECC.

FIG. 3 is a diagram showing an example of a storage format of a second ECC area 323 of the memory cell array 320 according to the first embodiment of the present disclosure. As described above, in the (n*m+1)-th page, the second ECC and the first ECC parity are stored in relation to each other. Here, one first ECC parity 620 is stored in relation to m second ECC entries 610. By storing a plurality of pieces of second ECC parity and a plurality of pieces of additional information in accordance with the size of a data area in a writing unit, it is possible to efficiently use an area for storing the second ECC parity.

The second ECC entry 610 stores second ECC parity 611, a target physical address 612, a second ECC valid flag 613, and an uncorrectable error generation flag 614 as additional information. As shown in FIG. 2, information on the target physical address 612 represents a physical address of a writing unit in a front position, in the case where the second ECC blocks #1 to #m are constantly arranged physically and continuously.

The second ECC 611 is parity of an error detection and correction code with respect to the second data unit including a plurality of first data units.

The target physical address 612 represents a physical address of a data area to be a protection target of the second ECC 611 in the memory 300. The target physical address 612 includes a physical address in a front position of consecutive writing units in the case where the consecutive writing units are a protection target. In the case where discontinuous writing is permitted, the target physical address 612 includes m physical addresses.

The second ECC valid flag 613 is a flag showing whether or not the second ECC 611 is valid. Here, "ON" represents that the second ECC 611 is valid, and "OFF" represents that the second ECC 611 is invalid.

The uncorrectable error generation flag 614 is a flag that represents whether or not an error that is hard to correct with the first ECC has occurred in a data area to be a protection target of the second ECC 611. Here, "ON" represents that an error that is hard to correct with the first ECC has occurred, and "OFF" represents that the error has not occurred.

It should be noted that although an example in which additional information is stored in the memory cell array 320 has been described, the additional information may be stored and managed in the memory controller 200.

Figure 4:
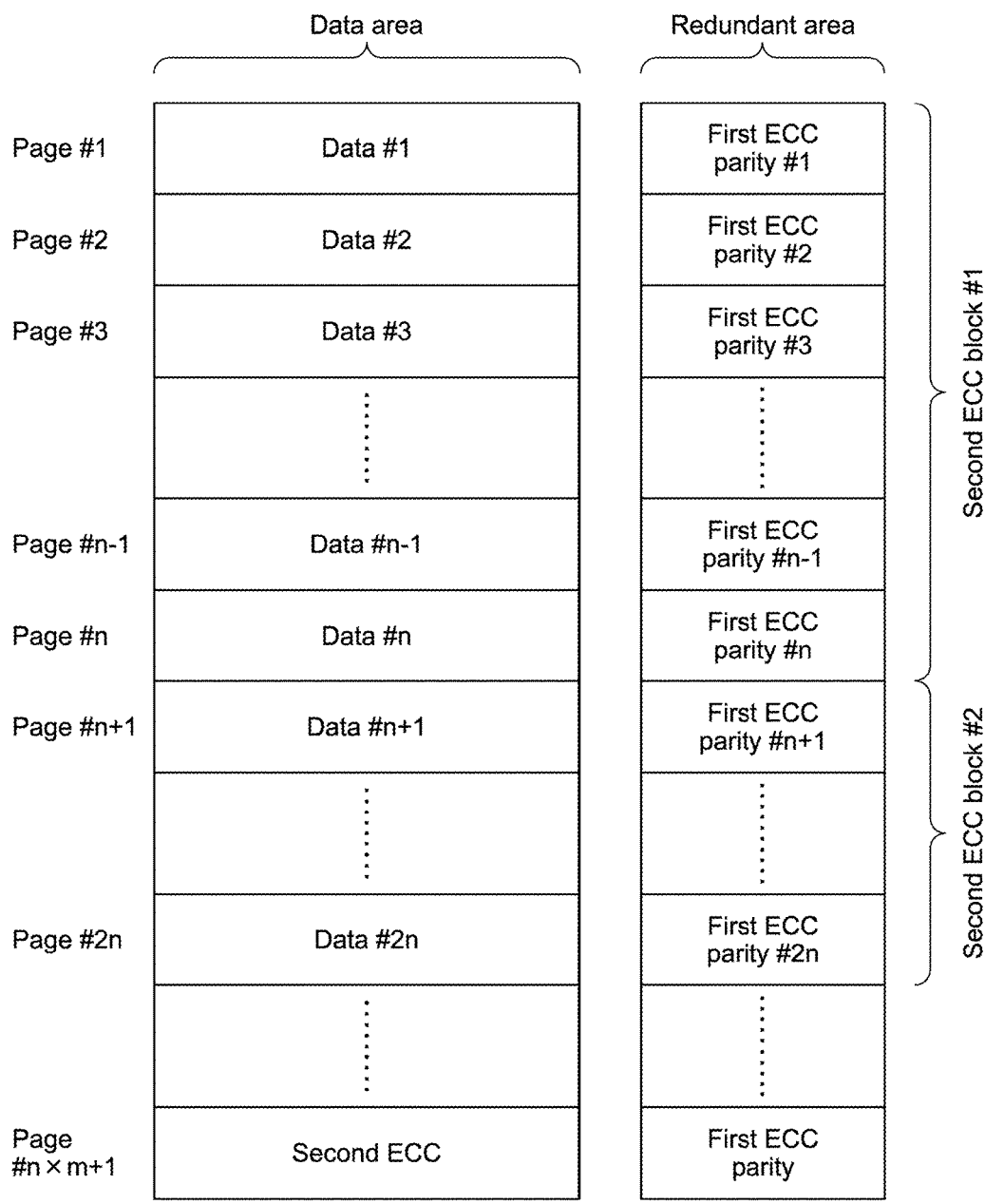
FIG. 4 is a diagram showing another example of a storage format of the memory cell array 320 according to an embodiment of the present disclosure.

FIG. 4 is a diagram showing another example of a storage format of the memory cell array 320 according to an embodiment of the present disclosure. A case where the memory 300 stores only a data area as a writing unit and the first ECC parity is written in an area independent from the data area is shown.

In this example, in the case where the data area and redundant area are different bank areas, it is possible to start writing of the first ECC parity in parallel with data writing similarly to the above-mentioned example. Moreover, as the storage format of the second ECC parity, it is favorable to store the second ECC parity and the additional information in a data area and to protect the data with the first ECC similarly to other data.

(Operation of Memory Controller)

Figure 5:
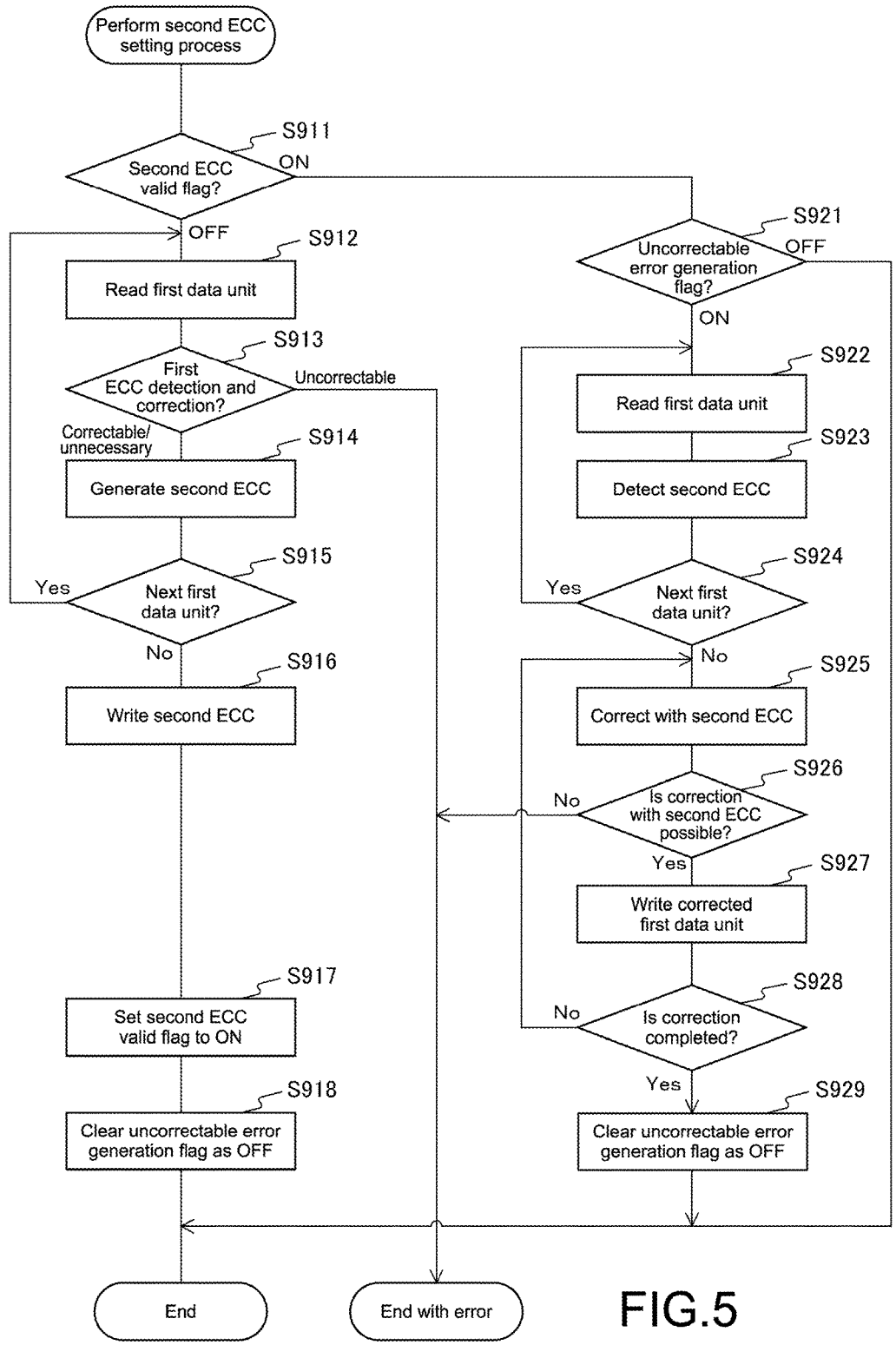
FIG. 5 is a flow diagram showing an example of a process procedure of a second ECC setting process according to the first embodiment of the present disclosure.

FIG. 5 is a flow diagram showing an example of a process procedure of a second ECC setting process according to the first embodiment of the present disclosure. When receiving a command for setting the second ECC from the host computer 100, the memory controller 200 performs the following second ECC setting process. In the second ECC setting process, the second ECC is made to be valid unless the second ECC in a target area is invalid. On the other hand, no operation is made in the case where the second ECC is valid and an error that is hard to correct with the first ECC has not occurred. Error correction is performed with the second ECC in the case where an error that is hard to correct with the first ECC has occurred.

In order to achieve this, the second ECC valid flag 613 is checked first, a process that makes the second ECC valid after Step S912 is performed in the case where the second ECC valid flag 613 is invalid (Step S911: OFF), and a process after Step S921 is performed in the case where the second ECC valid flag 613 is valid (Step S911: ON).

In the process that makes the second ECC valid, the first data units are sequentially read (Step S912). In the case where an error in the read first data unit has been detected and the error is uncorrectable with the first ECC (Step S913), the second ECC setting process is terminated with error without generating the second ECC. On the other hand, the second ECC is generated in the case where an error has not detected in the first data unit or a detected error is correctable with the first ECC (Step S914). All the first ECCs in a target area are read (Step S915: No), the generated second ECC is written to the second ECC 611 (Step S916). Then, the second ECC valid flag 613 is set to "ON" representing "valid" (Step S917). Moreover, the uncorrectable error generation flag 614 is cleared as "OFF" representing "unoccurring" (Step S918).

In the case where the second ECC valid flag 613 represents to be valid (Step S911: ON), the uncorrectable error generation flag 614 is checked, and the process is terminated as it is if an error that is hard to correct with the first ECC has not occurred (Step S921: OFF). In the case where an error that is hard to correct with the first ECC has occurred (Step S921: ON), the following process is performed. Specifically, the first data units are sequentially read (Step S922), and error detection with the second ECC is performed (Step S923) until all the first ECCs in a target area are read (Step S924: No). Then, data in which an error has occurred is attempted to be corrected with the second ECC (STEP S925). At this time, if correction with the second ECC is not possible (Step S926: No), the second ECC setting process is terminated with error without reflecting it on the memory 300. On the other hand, if correction with the second ECC is possible (Step S926: Yes), the corrected first data unit is overwritten to the memory 300 (Step S927). Because the state of having an error that is hard to correct with the first ECC is corrected when correction is completed in a target area (Step S928), the uncorrectable error generation flag 614 is cleared as "OFF" representing "unoccurring" (Step S929).

Figure 6:
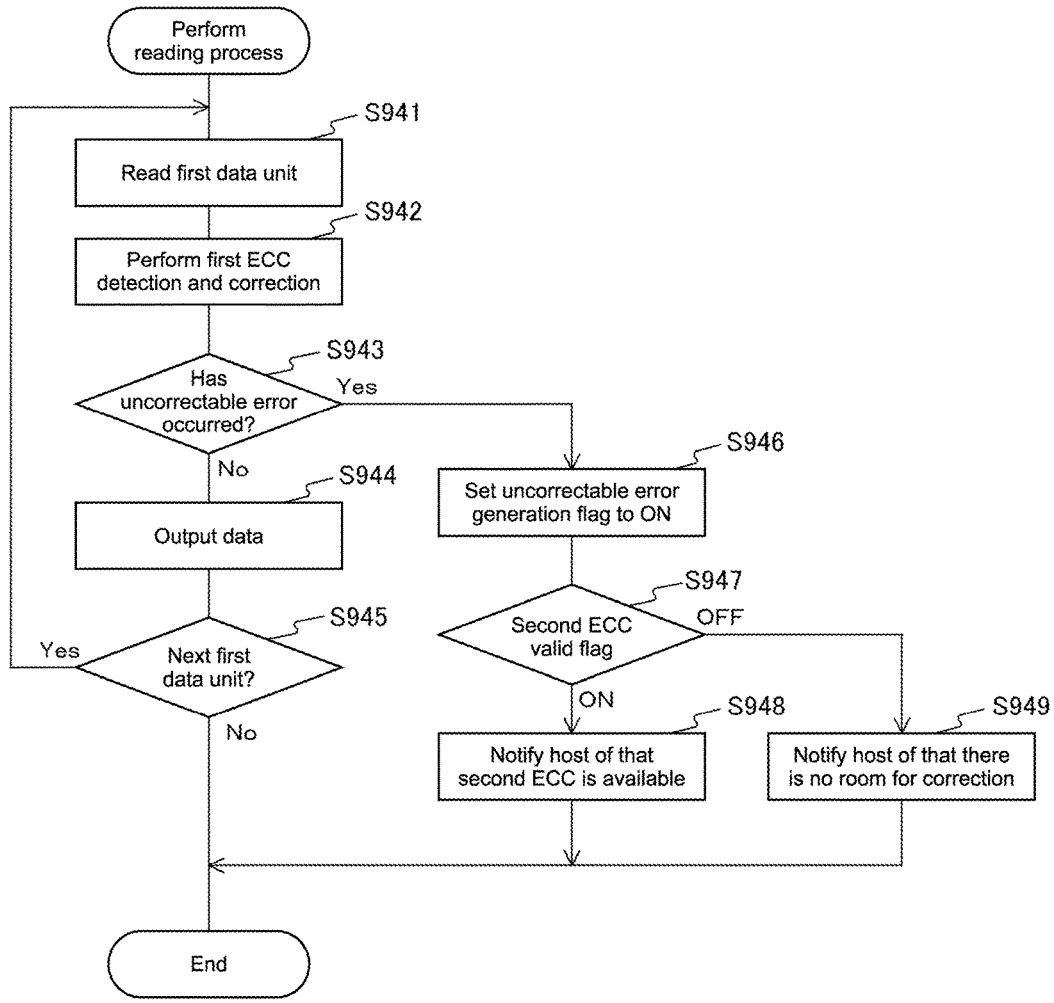
FIG. 6 is a flow diagram showing an example of a process procedure of a reading process according to the first embodiment of the present disclosure.

FIG. 6 is a flow diagram showing an example of a process procedure of a reading process according to the first embodiment of the present disclosure. When receiving a command for reading from the host computer 100, the memory controller 200 performs the following reading process. In the reading process, data of a designated size is read in the first data unit being the minimum unit under instruction from the controller 210 (Step S941). An error detection and correction process with the first ECC is performed on the read first data unit (Step S942). In the case where an error is not detected or a detected error is corrected (Step S943: No), data not including the error is output (Step S944). These processes are repeated until the designated size is satisfied (Step S945).

It should be noted that the reading process is terminated and the uncorrectable error generation flag 614 is set to "ON" representing "occurred" (Step S946) in the case where an error that is hard to be corrected with the first ECC has occurred (Step S943: Yes). Furthermore, in the case where the second ECC valid flag 613 does not represent "valid" (Step S947: OFF), the host computer 100 is notified of that there is no room for correction (Step S949). In the case where the second ECC valid flag 613 represents "valid" (Step S947: ON), the host computer 100 is notified of that there is room for correction with the second ECC although correction with the first ECC is not possible (Step S948). Accordingly, it is possible to encourage a command for restoration with the second ECC from the host computer 100. On the other hand, the host computer 100 makes attempts to eliminate the state where an uncorrectable error has occurred, by issuing the above-mentioned command for setting the second ECC.

Figure 7:
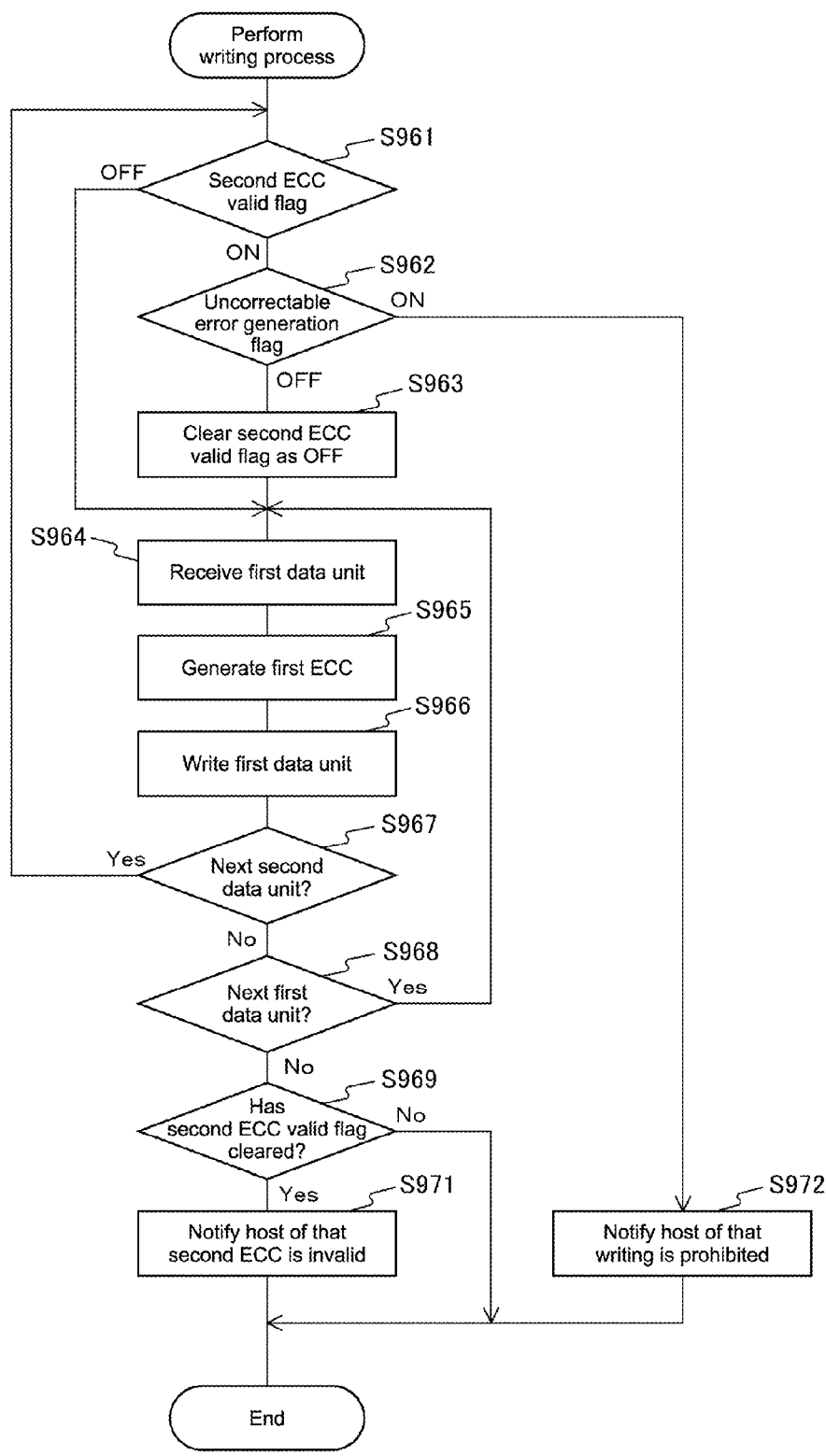
FIG. 7 is a flow diagram showing an example of a process procedure of a writing process according to the first embodiment of the present disclosure.

FIG. 7 is a flow diagram showing an example of a process procedure of a writing process according to the first embodiment of the present disclosure. When receiving a command for writing from the host computer 100, the memory controller 200 performs the following wiring process. In the writing process, the second ECC valid flag 613 is checked first. In the case where the second ECC valid flag 613 is set to "OFF" (Step S961: OFF), normal writing is started as it is. In the case where the second ECC valid flag 613 is set to "ON" (Step S961: ON), the uncorrectable error generation flag 614 is checked (Step S962). Then, in the case where an error that is hard to correct with the first ECC has occurred (Step S962: ON), the host computer 100 is notified of that writing is prohibited (Step S972). Accordingly, it is possible to encourage a command for restoration with the second ECC from the host computer 100. On the other hand, by issuing the above-mentioned command for setting the second ECC, the host computer 100 makes attempts to eliminate the state where an uncorrectable error has occurred.

In the case where an error that is hard to correct with the first ECC has not occurred (Step S962: OFF), the second ECC valid flag 613 is cleared as "OFF" (Step S963).

When writing data is received from the host computer 100 for each first data unit (Step S964), the ECC processing unit 220 generates the first ECC (Step S965), and writes it to the memory 300 in accordance with an instruction from the controller 210 (Step S966).

The processes from Steps S964 to S966 are repeated on writing data of a designated size with the first data unit being the minimum unit (Step S968). It should be noted that when there is a separation of the second data units, the process returns to Step S961. Then, the process of Step S961 and subsequent Steps is repeated Step S967).

In the case where the second ECC valid flag 613 is cleared from "ON" to "OFF" in Step S963 (Step S969: Yes), the host computer is notified of that the second ECC valid flag 613 represents "invalid" (Step S971). Accordingly, it is possible to encourage a new command for setting the second ECC from the host computer 100. On the other hand, by issuing the above-mentioned command for setting the second ECC, the host computer 100 makes attempts to set a new second ECC.

Figure 8:
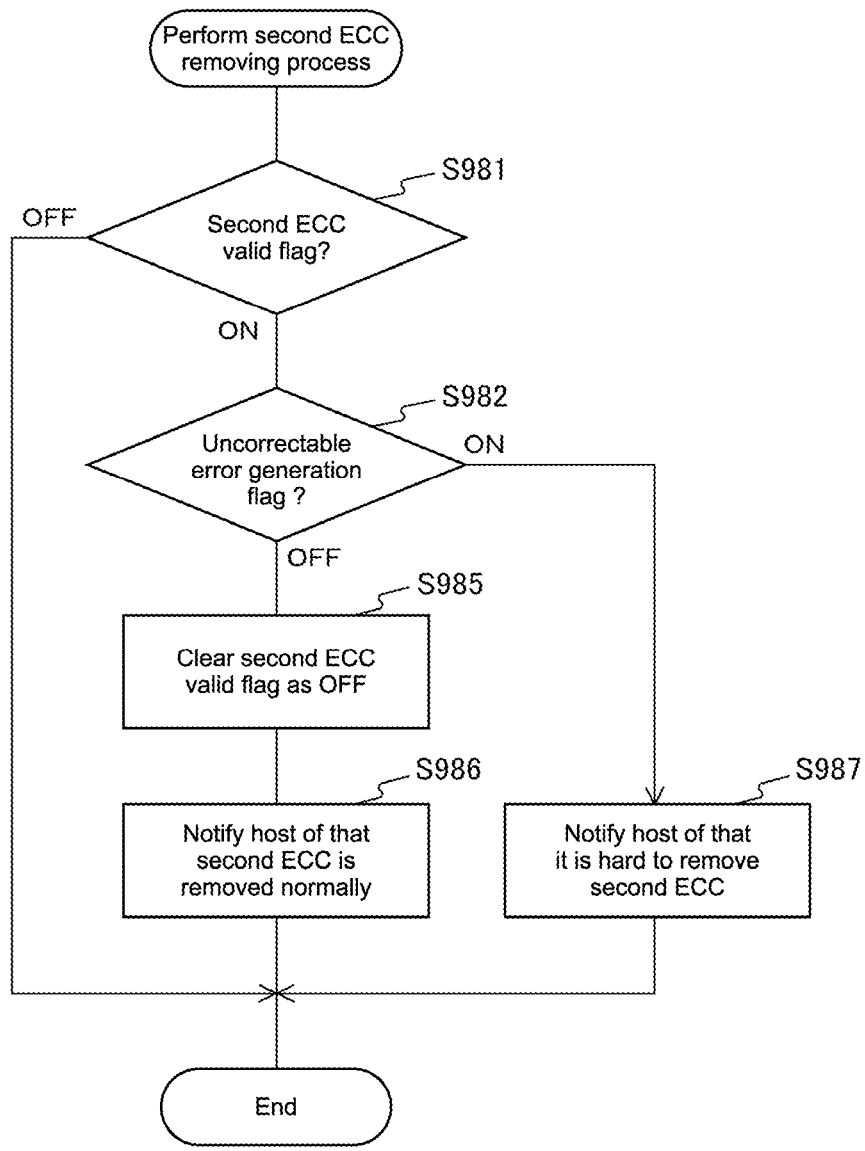
FIG. 8 is a flow diagram showing an example of a process procedure of a second ECC removing process according to the first embodiment of the present disclosure.

FIG. 8 is a flow diagram showing an example of a process procedure of a second ECC removing process according to the first embodiment of the present disclosure. When receiving a command for removing the second ECC from the host computer 100, the memory controller 200 performs the following second ECC removing process. A command for the second ECC removing process is issued in the case where there is no need of the second ECC or the second ECC is desired to be cleared before a wiring process. More specifically, the second ECC removing process is assumed to be performed when switching from cold data to hot data. Rewiring is not performed in the cold data for a long time, and rewriting is frequently performed in the hot data.

In the second ECC removing process, first, the second ECC valid flag 613 is checked, and the process is finished as it is in the case where the second ECC valid flag 613 is set to "OFF" (Step S981: OFF). In the case where the second ECC valid flag 613 is set to "ON" (Step S981: ON), the uncorrectable error generation flag 614 is checked. Then, in the case where an error that is hard to correct with the first ECC has occurred (Step S982: ON), the host computer 100 is notified of that it is hard to remove the second ECC (Step S987). Accordingly, it is possible to encourage a command for restoration with the second ECC from the host computer 100. On the other hand, by issuing the above-mentioned command for setting the second ECC, the host computer 100 makes attempts to eliminate the state where an uncorrectable error has occurred.

In the case where an error that is hard to correct with the first ECC has not occurred (Step S982: OFF), the second ECC valid flag 613 is cleared as "OFF," and the state is changed to the one where the second ECC is invalid (Step S985). Then, the host computer 100 is notified of that the second ECC has been removed normally (Step S986).

Figure 9:
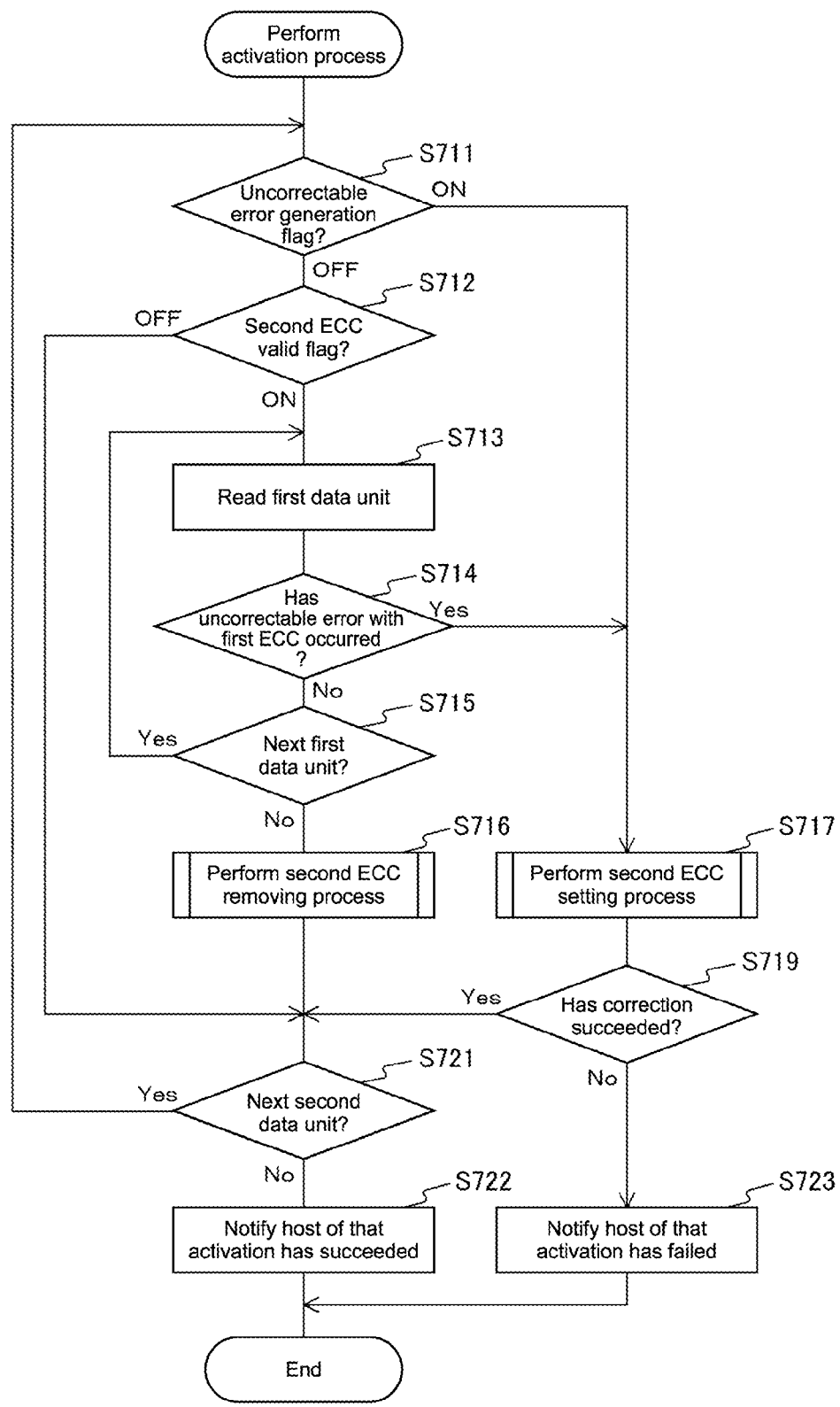
FIG. 9 is a flow diagram showing an example of a process procedure of an activation process according to the first embodiment of the present disclosure.

FIG. 9 is a flow diagram showing an example of a process procedure of an activation process according to the first embodiment of the present disclosure. The memory controller 200 performs the following activation process when a command for activating a storage system is issued. In the activation process, all unreadable errors occurred by the time of the previous shutdown in all storage areas are corrected with the second ECC at the time of activation. The second ECC is removed in the case where it is confirmed that an error that is hard to correct with the first ECC has not occurred, and otherwise the error is corrected. Thus, work for preparing for operation as a storage system is performed. These processes are performed right after the memory controller 200 is activated, or when a command for activation of the memory controller 200 is issued from a host.

First, the uncorrectable error generation flag 614 is checked with respect to the first second data unit (Step S711). In the case where the uncorrectable error generation flag 614 represents "OFF" (Step S711: OFF), the second ECC valid flag 613 is checked (Step S712), and the second data unit for which the corresponding second ECC 611 is invalid is skipped (Step S712: OFF).

In the case where the second ECC valid flag 613 represents "ON" (Step S712: ON), the first data units in the second data unit are sequentially read (Step S713), and it is confirmed that correction with the first ECC is not possible (Step S714). Until reading and confirmation of the target second data unit is finished, a process for the subsequent first data unit is repeated (Step S715). When reading in the first data units in the target second data unit is finished, a process for removing the target second ECC is performed (Step S716). The second ECC removing process is the same as that described in FIG. 8.

In the case where the uncorrectable error generation flag 614 represents "ON" (Step S711: ON) or an error that is hard to correct with the first ECC has occurred (Step S714: Yes), a process for setting the second ECC is performed (Step S717). The second ECC setting process is the same as that described in FIG. 5. Then, in the case where a bit error correction process in the second ECC setting process has succeeded (Step S719: Yes), the process proceeds to a process for the next second data unit. In the case where a bit error correction process in the second ECC setting process has failed (terminated with error) (Step S719: No), the host computer 100 is notified of that the activation process has failed (Step S723).

The process for all the second data units is finished (Step S721: No), the host computer 100 is notified of that the activation process has succeeded (Step S722).

Figure 10:
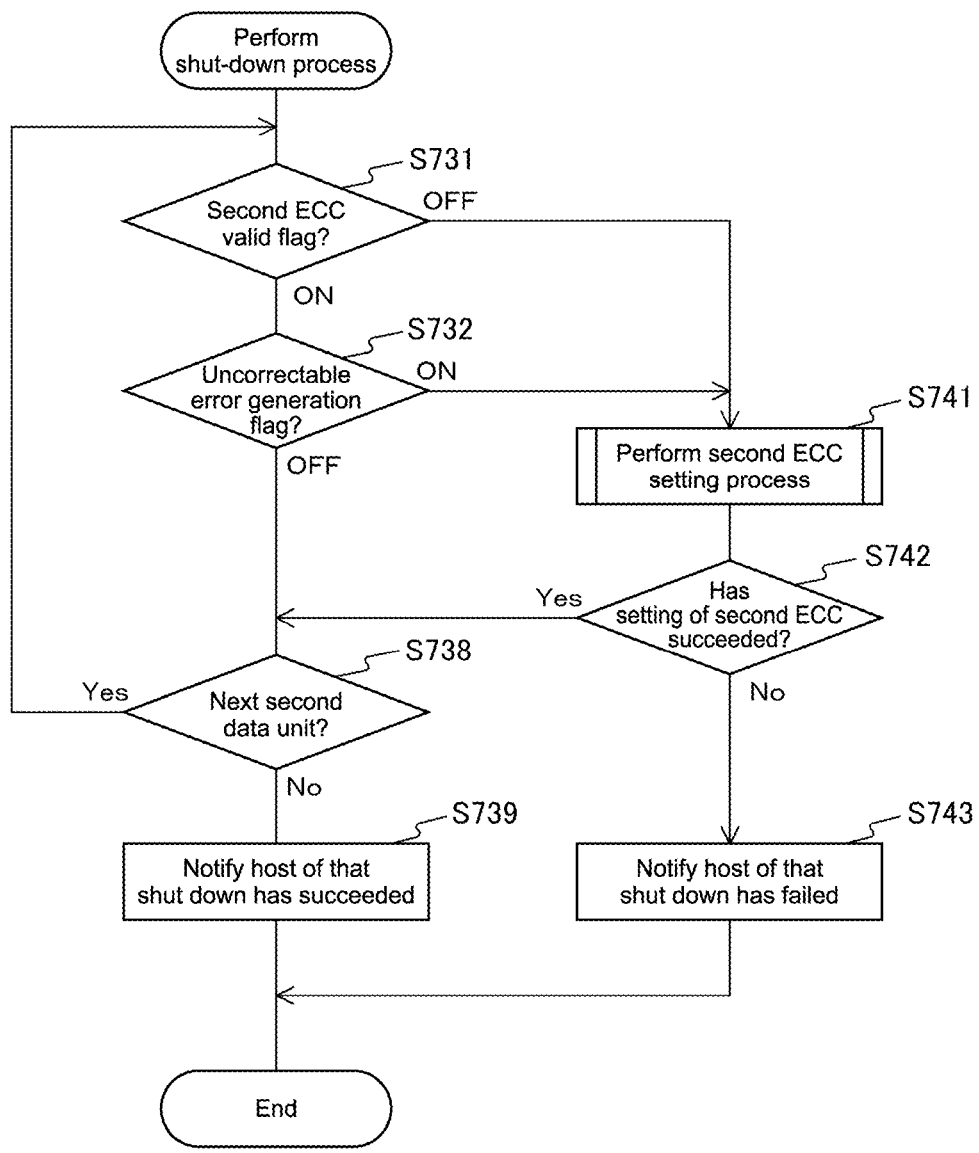
FIG. 10 is a flow diagram showing an example of a process procedure of a shut-down process according to the first embodiment of the present disclosure.

FIG. 10 is a flow diagram showing an example of a process procedure of a shut-down process according to the first embodiment of the present disclosure. When a command of shutdown of a storage system is issued from the host computer 100, the memory controller 200 performs the following shut-down process. In the shut-down process, the state of the memory 300 is checked, and the second data unit that can be corrected with the second ECC is corrected by performing the second ECC setting process. Then, work for preparing for shutdown is performed. After shutdown is performed, because it is expected that there is a lot of time until the next activation is performed and writing is performed, protection with the second ECC is performed.

First, as the first second data unit being a target, the uncorrectable error generation flag 614 is checked, and the second ECC valid flag 613 is checked (Step S731) in the case where an error that is hard to correct with the first ECC has not occurred (Step S731: OFF).

Regarding the second data unit for which the second ECC is valid (Step S732: ON), because the second ECC is valid and no data that is hard to correct is generated, the process proceeds to a process for the next second data unit (Step S738: Yes).

In the case where an error that is hard to correct with the first ECC has occurred (Step S731: ON), or in the case of the second data unit for which the second ECC is invalid even if the error has not occurred (Step 732: OFF), the second ECC setting process is performed (Step S741). The second ECC setting process is the same as that described in FIG. 5. In the case where setting of the second ECC has succeeded, the process proceeds to the process for the next second data unit (Step S742: Yes). In the case where setting of the second ECC has failed, the host computer 100 is notified of that shutdown has failed (Step S743). The processes from Step S741 to Step S743 are the common processes in the following.

These processes are sequentially performed for all the second data units. Then, when the process for all the second data units is finished (Step S738: No), the host computer 100 is notified of that shutdown has succeeded (Step S739).

As described above, according to the first embodiment of the present disclosure, by storing generation of an error that is hard to correct with the first ECC as the uncorrectable error generation flag 614, it is possible to perform a correction process with the second ECC at arbitrary timing.

2. Second Embodiment (Configuration of Information Processing System)

Figure 11:
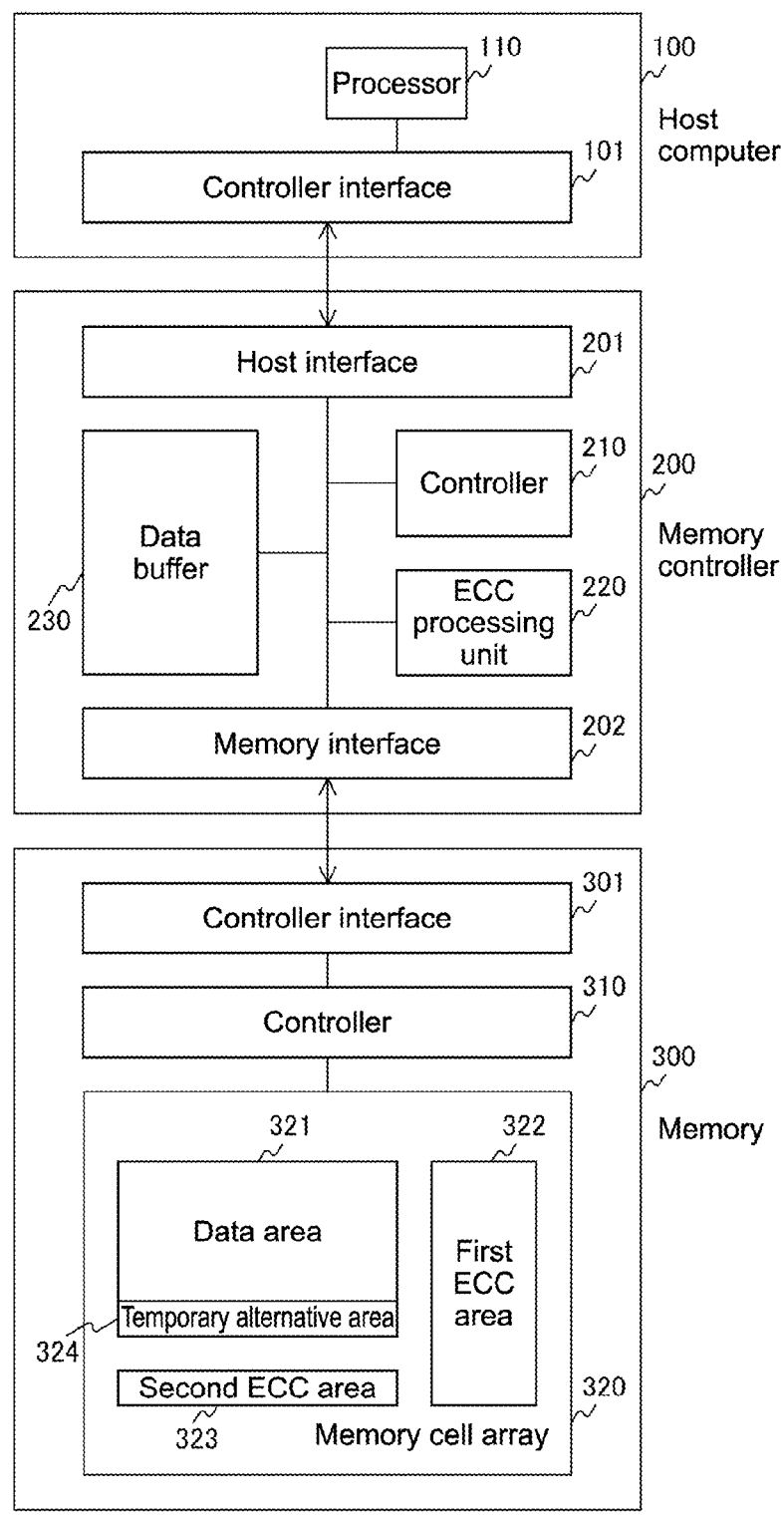
FIG. 11 is a diagram showing a configuration example of an information processing system according to a second embodiment of the present disclosure.

FIG. 11 is a diagram showing a configuration example of an information processing system according to a second embodiment of the present disclosure. The information processing system according the second embodiment is different from that according to the first embodiment in that a temporary alternative area 324 is provided in the data area 321. Because other configurations are the same, detailed description thereof is omitted.

The temporary alternative area 324 is an area for temporarily storing the content of new writing so that the second ECC can be used continuously in the case where the new writing is performed in an area protected by the second ECC.

(Storage Format of Memory Cell Array)

Figure 12:
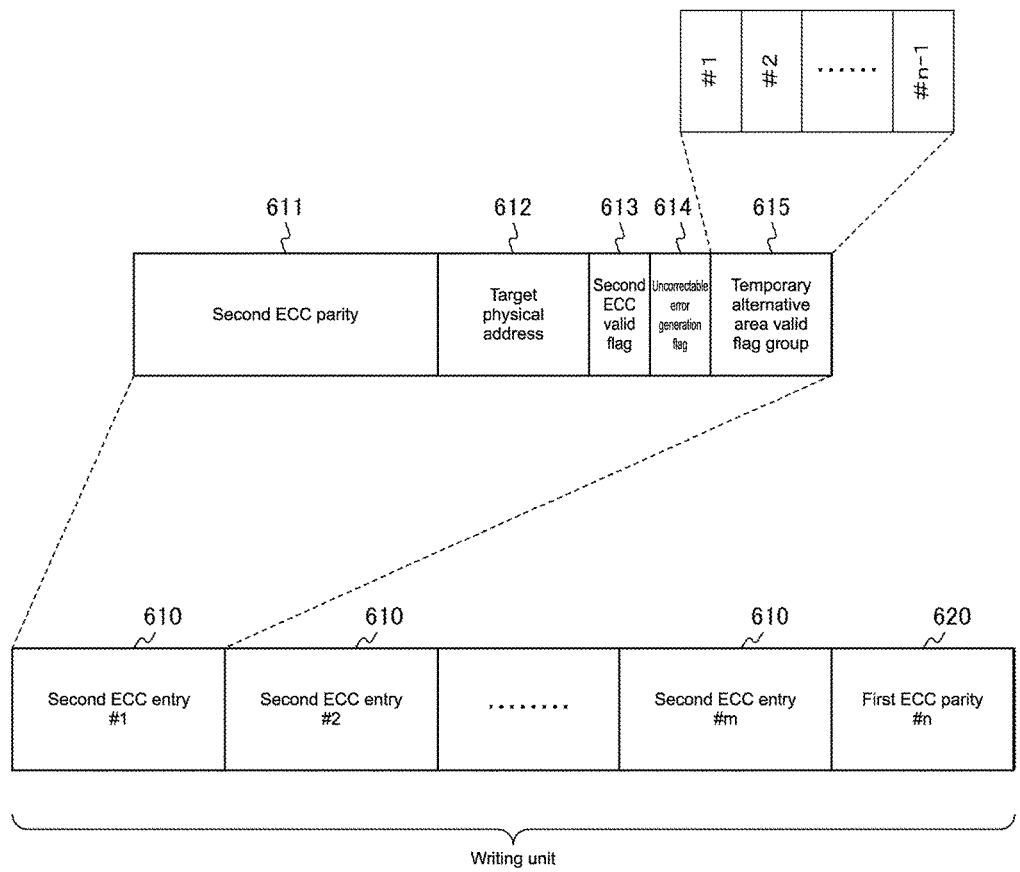
FIG. 12 is a diagram showing an example of a storage format of the second ECC area 323 of the memory cell array 320 according to the second embodiment of the present disclosure.

FIG. 12 is a diagram showing an example of a storage format of the second ECC area 323 of the memory cell array 320 according to the second embodiment of the present disclosure. The second ECC entry 610 according to the second embodiment is different from that according to the first embodiment in that it further includes temporary alternative area valid flag group 615. Because other configurations are the same, detailed description thereof is omitted.

The temporary alternative area valid flag group 615 is a flag group that represents whether or not there is a valid temporary alternative area corresponding to each page #1 to #(n−1). Here, "ON" represents that a corresponding temporary alternative area is valid, and "OFF" represents that a corresponding temporary alternative area is invalid (there is no corresponding temporary alternative area).

It should be noted that although an examples in which additional information including the temporary alternative area valid flag group 615 is stored in the memory cell array 320 has been shown here, the additional information may be stored and managed in the memory controller 200.

(Operation of Memory Controller)

Figure 13:
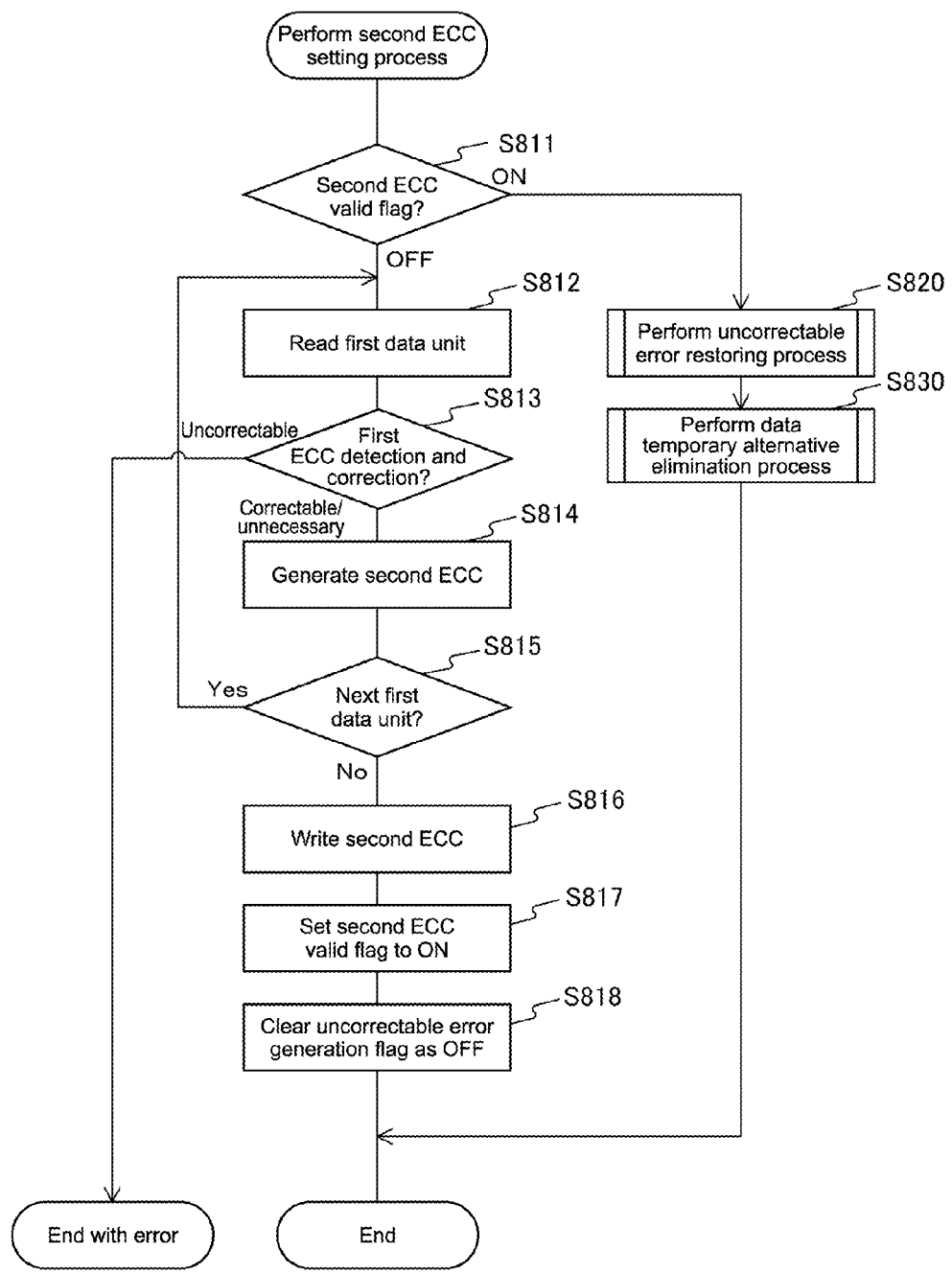
FIG. 13 is a flow diagram showing a process procedure of a second ECC setting process according to the second embodiment of the present disclosure.

FIG. 13 is a flow diagram showing a process procedure of a second ECC setting process according to the second embodiment of the present disclosure. When receiving a command for setting the second ECC from the host computer 100, the memory controller 200 performs the following second ECC setting process. In the case where the second ECC valid flag 613 is valid (Step S811: OFF), the second ECC setting process according to the second embodiment is the same as that according to the first embodiment (Steps S811 to S817). Moreover, in the case where the second ECC is invalid (Step S811: ON), the process for restoring an error that is hard to correct with the first ECC (Step S820) is different from that according to the first embodiment in that the process includes the data temporary alternative elimination process (Step S830).

Figure 14:
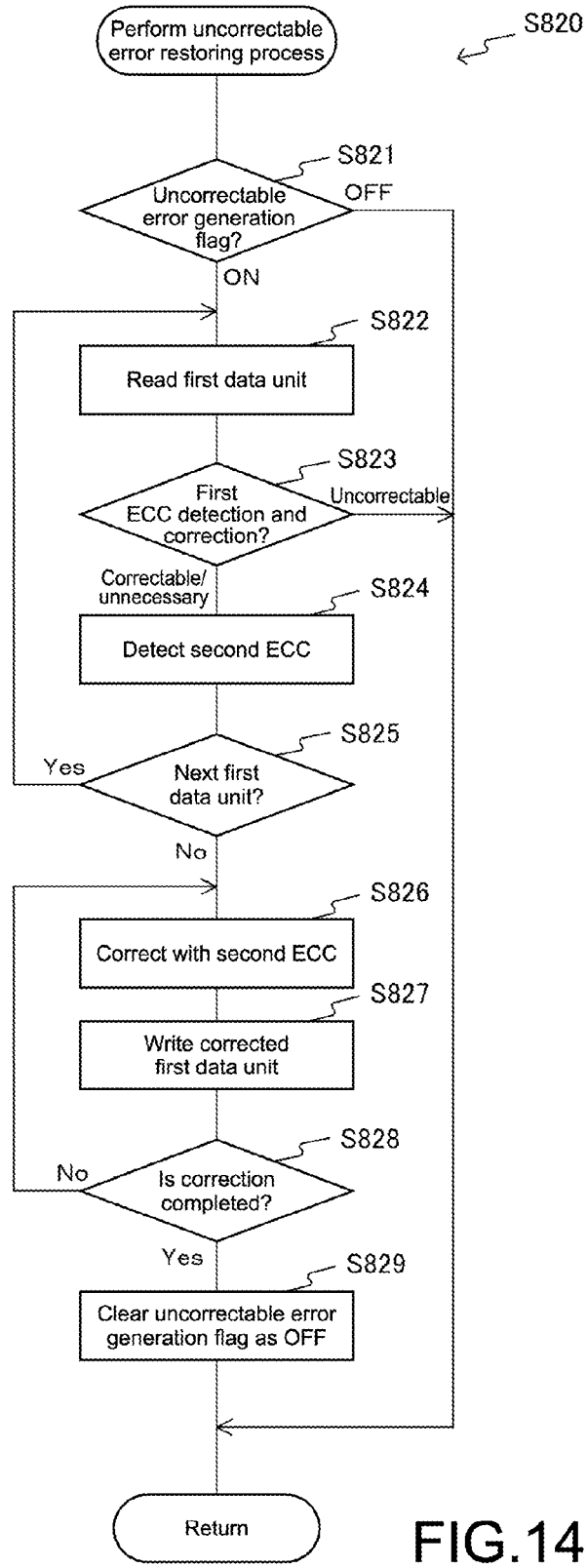
FIG. 14 is a flow diagram showing a process procedure of an uncorrectable error restoring process according to the second embodiment of the present disclosure.

FIG. 14 is a flow diagram showing a process procedure of an uncorrectable error restoring process according to the second embodiment of the present disclosure (Step S820). The uncorrectable error restoring process is basically the same as Steps S921 to S928 in the first embodiment.

First, the uncorrectable error generation flag 614 is checked, and the process is finished as it is if an error that is hard to correct with the first ECC has not occurred (Step S821: OFF). In the case where an error that is hard to correct with the first ECC has occurred (Step S821: ON), the following process is performed. Specifically, the first data units are sequentially read (Step S822), and error detection is performed (Steps S823 and S824) until all the first ECCs in a target area are read (Step S825: No). It should be noted that in the case where an error that is hard to correct with the first ECC has been detected (Step S823: uncorrectable), the process is finished as it is. On the other hand, in the case where an error that can be corrected with the first ECC has been detected and corrected, or where the error has not been detected and correction is unnecessary (step S823: correctable/unnecessary), error detection with the second ECC is performed (Step S824). Then, correction with the second ECC is performed on data in which an error had occurred (Step S826), and the corrected first data unit is overwritten to the memory 300 (Step S827). Because the state of including an error that is hard to correct with the first ECC is restored when correction for a target area is finished (Step S828), the uncorrectable error generation flag 614 is cleared as "OFF" representing "unoccurring" (Step S829).

Figure 15:
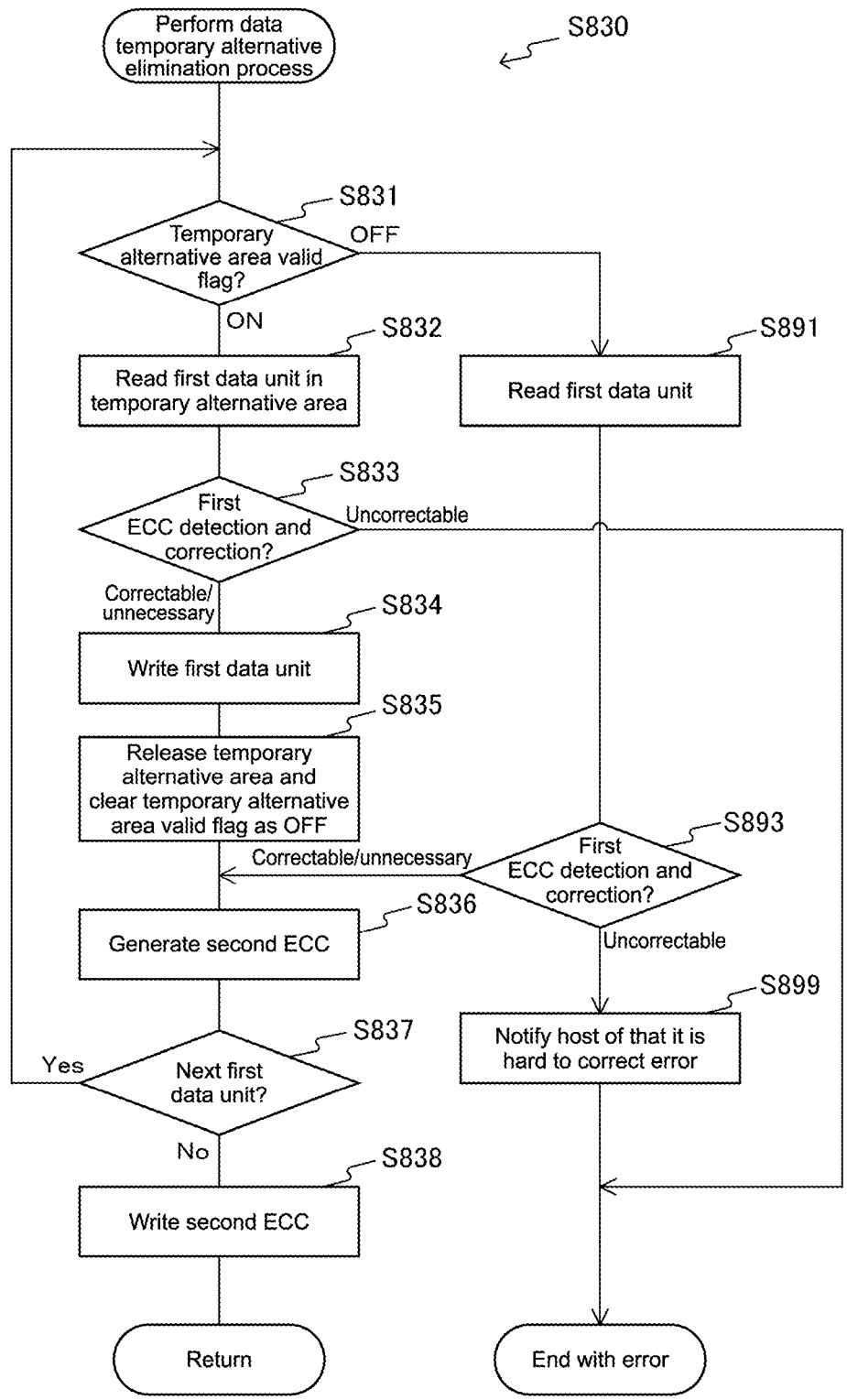
FIG. 15 is a flow diagram showing a process procedure of data temporary alternative elimination process according to the second embodiment of the present disclosure.

FIG. 15 is a flow diagram showing a process procedure of data temporary alternative elimination process according to the second embodiment of the present disclosure (Step S830). In the data temporary alternative elimination process, whether or not there is the temporary alternative area is checked and the temporary alternative area is eliminated, with data in a data area in each page being the first data unit.

If a flag in a corresponding page in the temporary alternative area valid flag group 615 does not represent valid (Step S831: OFF), there is no corresponding temporary alternative area. Therefore, the first data unit is read from a data area (Step S891). In the case where an error that is hard to correct with the first ECC has been detected (Step S893: uncorrectable), the host computer 100 is notified of that correction is not possible (Step S899), and the process is finished as it is. On the other hand, in the case where an error that can be corrected with the first ECC has been detected and corrected or where the error has not detected and correction is unnecessary (Step S893: correctable/unnecessary), the process proceeds to a process of forming the second ECC (Step S836).

On the other hand, a flag in a corresponding page in the temporary alternative area valid flag group 615 represents valid (Step S831: ON), the first data unit is read from the temporary alternative area (Step S832). Here, in the case where an error that is hard to correct with the first ECC has been detected (Step S833: uncorrectable), the process is finished as it is. On the other hand, in the case where an error that can be corrected with the first ECC has been detected and corrected, or where the error has not detected and correction is unnecessary (Step S833: correctable/unnecessary), the read first data unit is written to the data area (Step S834). Then, the first data unit in the temporary alternative area is released, and a flag in a corresponding page in the temporary alternative area valid flag group 615 cleared as "OFF" (Step S835).

Even in any of these cases, the second ECC is generated based on the obtained first data unit (Step S836). These processes are repeated for the first data units in the second data unit being a target (Step S837). The second ECC generated in this way is written to the second ECC area 323 (Step S838). Accordingly, the temporary alternative area corresponding to the second data unit is eliminated.

Figure 16:
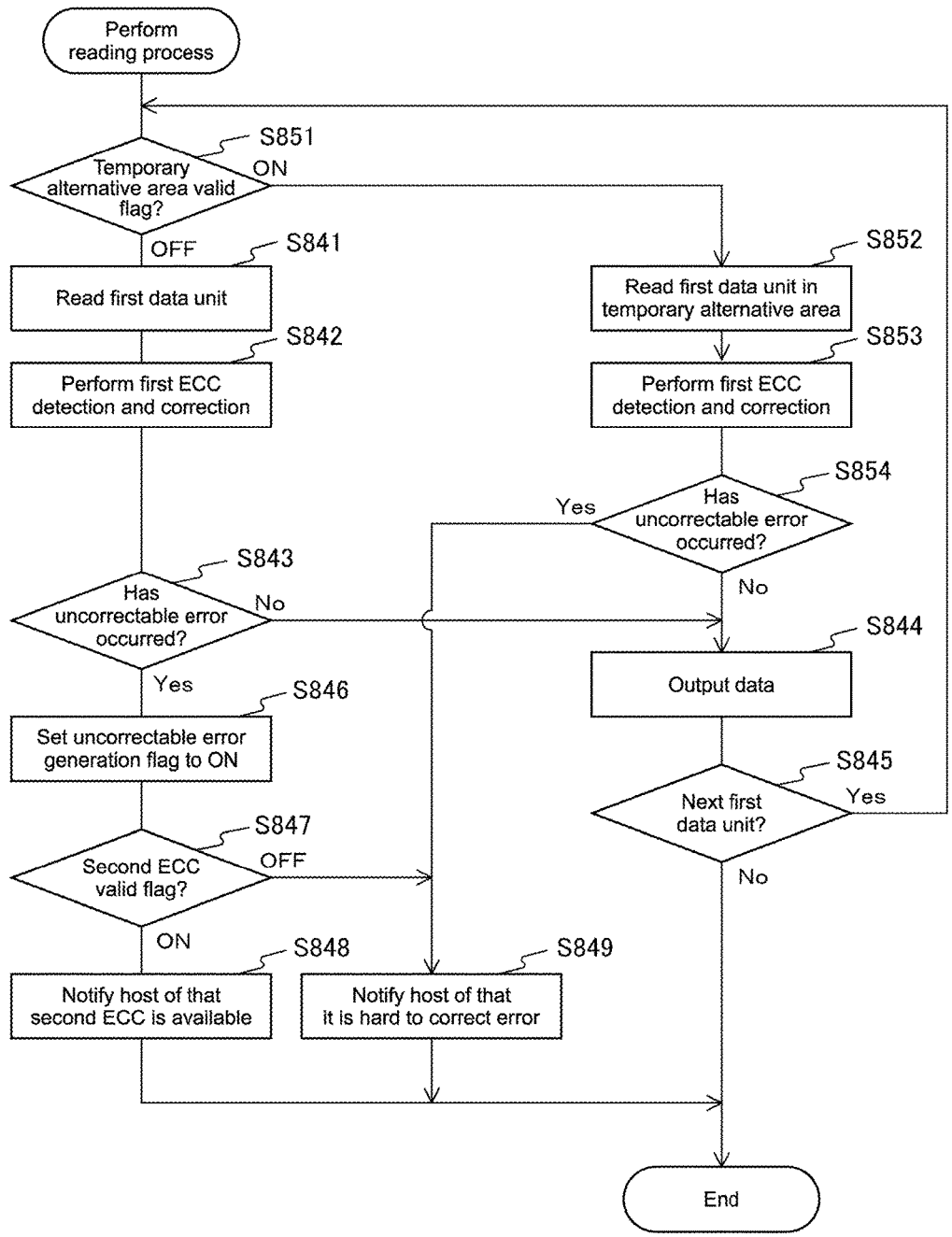
FIG. 16 is a flow diagram showing an example of a process procedure of a reading process according to the second embodiment of the present disclosure.

FIG. 16 is a flow diagram showing an example of a process procedure of a reading process according to the second embodiment of the present disclosure. When receiving a command for reading from the host computer 100, the memory controller 200 performs the following reading process. The reading process according to the second embodiment is the same as that according to the first embodiment (Steps S841 to S849) if a flag in a corresponding page in the temporary alternative area valid flag group 615 does not represent valid (Step S851: OFF).

On the other hand, if a flag in a corresponding page in the temporary alternative area valid flag group 615 represents valid (Step S851: ON), the first data unit in the temporary alternative area is read (Step S852), and an error detection and correction process with the first ECC is performed (Step S853). Then, in the case where an error that is hard to correct with the first ECC has occurred (Step S854: Yes), the host computer 100 is notified of that there is no room for correction (Step S849).

In the case where an error has not detected or where the detected error has been corrected (Step S854: No), data not including the error is output (step S844). These process are repeated until the designated size is satisfied (Step S845).

Figure 17:
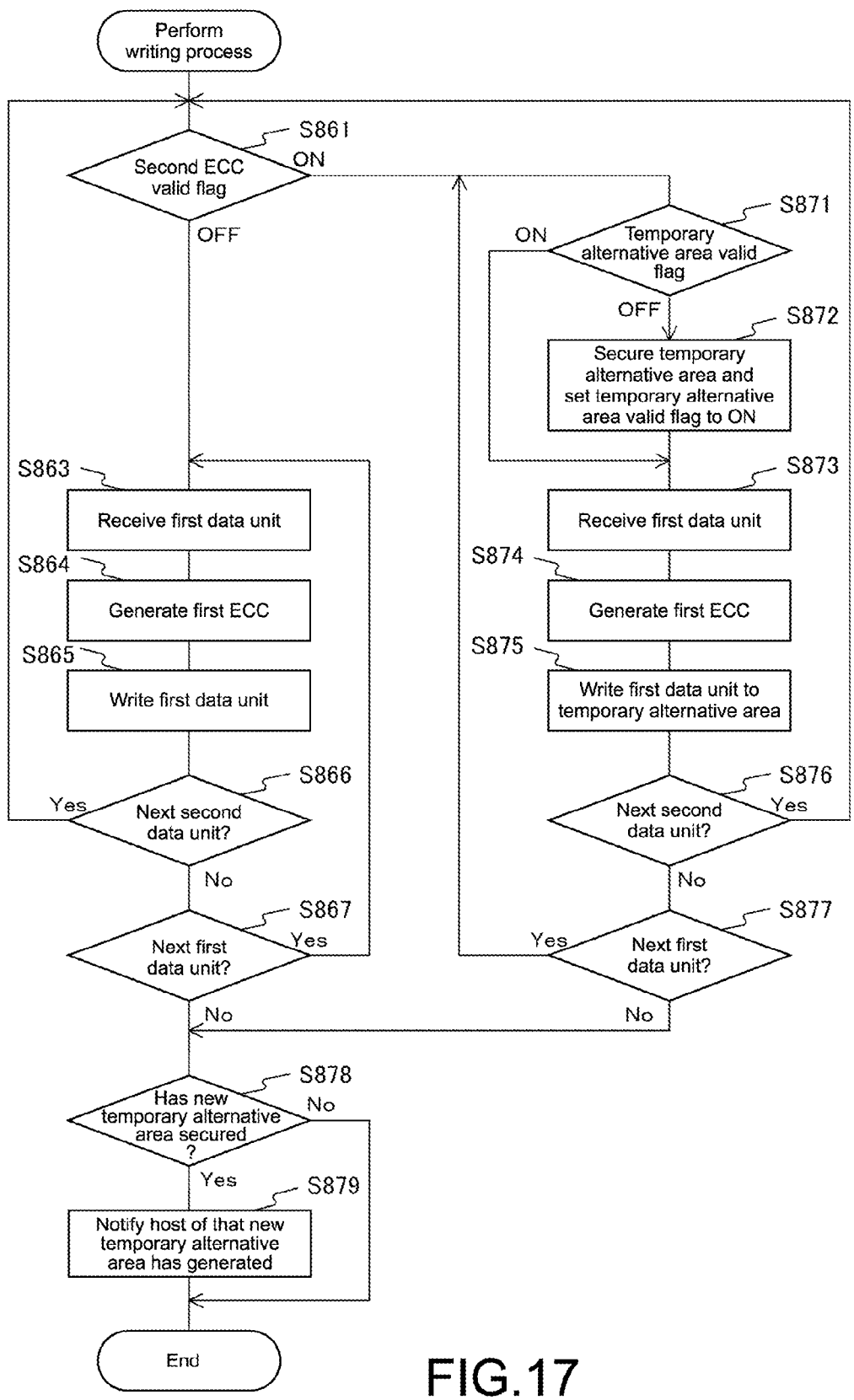
FIG. 17 is a flow diagram showing a process procedure of a writing process according to the second embodiment of the present disclosure.

FIG. 17 is a flow diagram showing a process procedure of a writing process according to the second embodiment of the present disclosure. When receiving a command for writing from the host computer 100, the memory controller 200 performs the following writing process. The writing process according to the second embodiment is the same as that according to the first embodiment (Steps S863 to S867) if the second ECC valid flag 613 does not represent valid (Step S861: OFF).

On the other hand, in the case where the second ECC valid flag 613 represents valid (Step S861: ON), a flag in a corresponding page in the temporary alternative area valid flag group 615 is checked. In the case where the second ECC valid flag 613 does not represent valid (Step S871: OFF), it is set to valid (Step S872). Accordingly, the temporary alternative area is prepared for being used. Then, when receiving write data for each first data unit from the host computer 100 (Step S873), the first ECC is generated by the ECC processing unit 220 (Step S874), and is written to the temporary alternative area (Step S875).

The processes from Steps S871 to S875 are repeated for write data of the designated size with the first data unit being the minimum unit (Step S877). It should be noted that when there is a separation of the second data units, the process returns to Step S861. Then, the process of Step S861 and subsequent Steps is repeated (Step S867).

In the case where a new temporary alternative area is ensured in Step S872 (Step S878: Yes), the host computer 100 is notified of that a new temporary alternative area is generated (Step S879).

Figure 18:
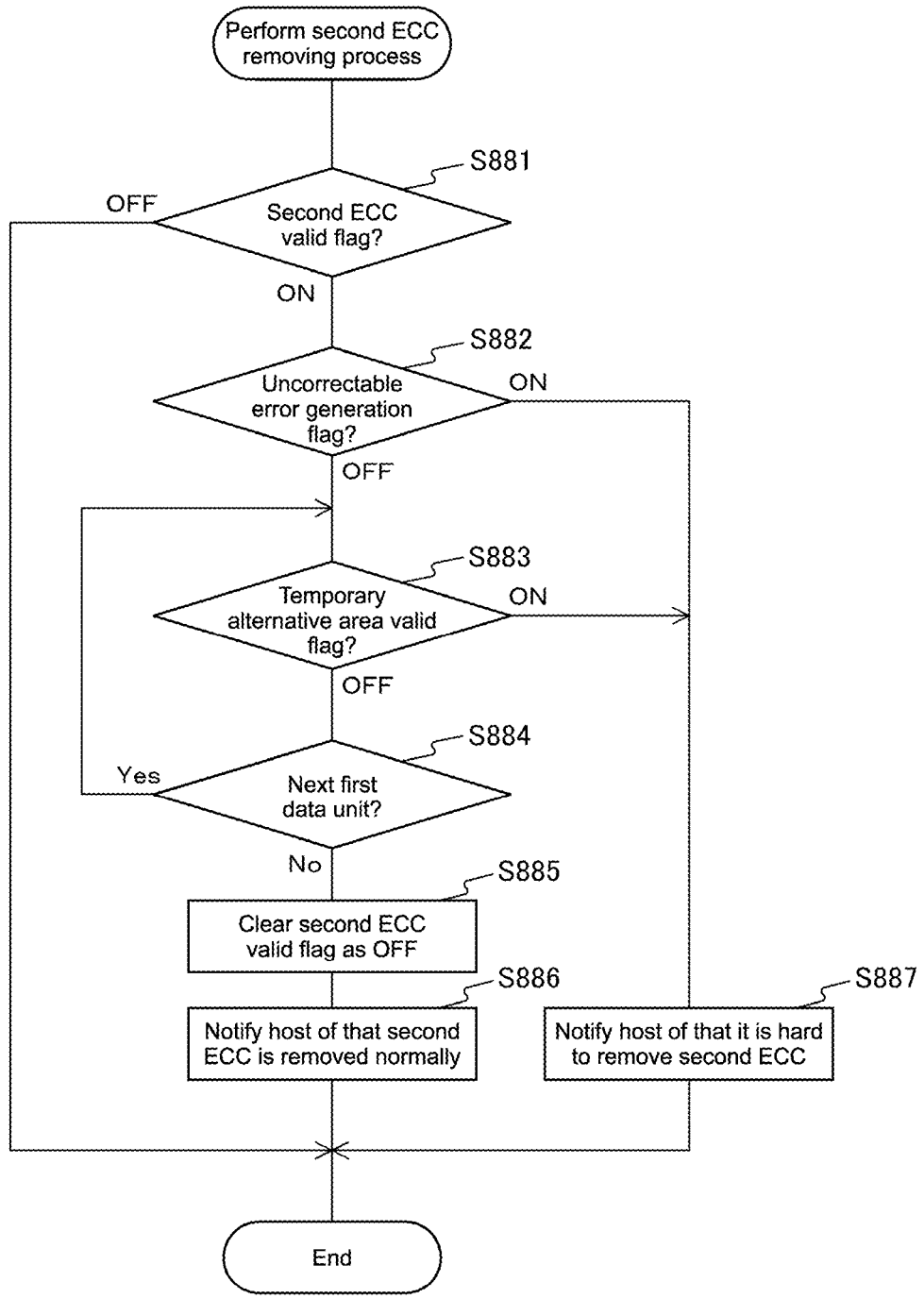
FIG. 18 is a flow diagram showing an example of a process procedure of a second ECC removing process according to the second embodiment of the present disclosure.

FIG. 18 is a flow diagram showing an example of a process procedure of a second ECC removing process according to the second embodiment of the present disclosure. When receiving a command for removing the second ECC from the host computer 100, the memory controller 200 performs the following second ECC removing process. The second ECC removing process according to the second embodiment is different from that according to the first embodiment in that the temporary alternative area valid flag group 615 is checked (Steps S881, and S884 to S886).

In the second ECC removing process, the second ECC valid flag 613 is checked first (Step S880), the process is finished as it is if the second ECC valid flag 613 represents "OFF" (Step S881: OFF). In the case where the second ECC valid flag 613 represents "ON" (Step S881: ON), the uncorrectable error generation flag 614 is checked (Step S882). Then, in the case where an error that is hard to correct with the first ECC has occurred (Step S882: ON), the host computer 100 is notified of that it is hard to remove the second ECC (Step S887). Moreover, flags in a corresponding page in the temporary alternative area valid flag group 615 are sequentially checked (Step S884), and the host computer 100 is notified of that it is hard to remove the second ECC (Step S887) also in the case where there is a valid temporary alternative area (Step S883: ON). Accordingly, it is possible to encourage a command for restoration with the second ECC from the host computer 100. On the other hand, by issuing the above-mentioned command for setting the second ECC, the host computer 100 makes attempts to eliminate the state where an uncorrectable error has occurred.

Otherwise, the second ECC valid flag 613 is cleared as "OFF," and the state is changed to one where the second ECC is invalid (Step S885). Then, the host computer 100 is notified of that the second ECC is removed normally (Step S886).

Figure 19:
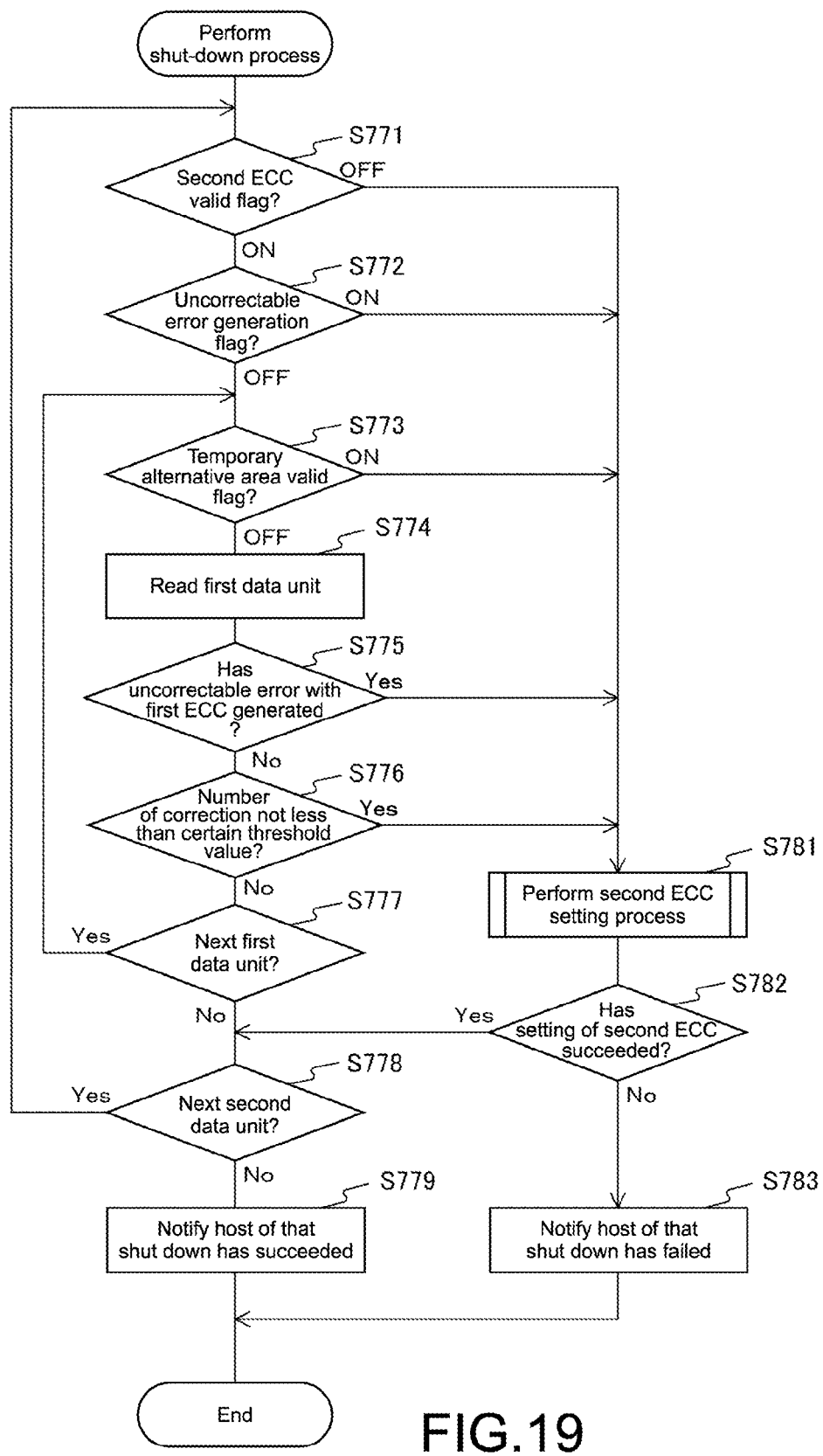
FIG. 19 is a flow diagram showing a process procedure of a shut-down process according to the second embodiment of the present disclosure.

FIG. 19 is a flow diagram showing a process procedure of a shut-down process according to the second embodiment of the present disclosure. The memory controller 200 performs the following shut-down process when a command for shutdown of a storage system is issued. The shut-down process according to the second embodiment is different from that according to the first embodiment in that the temporary alternative area valid flag group 615 is checked (Steps S771, S772, and S774 to S783). It should be noted that in the case where the bit number corrected with the first ECC is not less than a threshold value in Step S776, it is determined that it is highly likely to become uncorrectable by the next activation and the second ECC setting process is performed to correct data before shutdown.

As a part of checking of the second data unit being a target, flags in a corresponding page in the temporary alternative area valid flag group 615 are sequentially checked (Step S773), the second ECC setting process is performed (Step S781) in the case where there is a valid temporary alternative area. The second ECC setting process is the same as that described in FIG. 13.

It should be noted that although the activation process according to the second embodiment is not particularly shown, it is basically the same as that according to the first embodiment.

As described above, according to the second embodiment of the present disclosure, by providing the temporary alternative area, it is possible to use the second ECC continuously when new writing is performed to an area protected by the second ECC.

It should be noted that the embodiments of the present disclosure are shown as an example for implementing the present disclosure. The matters in the embodiments of the present invention have corresponding relations to the invention specifying matters in the claims. Similarly, the invention specifying matters in the claims have corresponding relations to the matters in the embodiments of the present invention having the same names as the invention specifying matters. It should be noted that the present technology is not limited to the above-mentioned embodiments and various modifications can be made without departing from the gist of the present technology.

Moreover, the process procedures described in the embodiments may be regarded as a method including the series of procedures, and may be regarded as a program that causes a computer to execute the series of procedures, or as a storage medium that stores the program. As the storage medium, a CD (Compact Disc), an MD (MiniDisc), a DVD (Digital Versatile Disc), a memory card, a Blu-ray (registered trademark) disc may be used, for example.

It should be noted that the present disclosure may also take the following configurations.

(1) A storage control apparatus, including:
an uncorrectable error generation flag management section configured to manage an uncorrectable error generation flag in a memory configured to store
a first error detection and correction code corresponding to a first data unit, and
a second error detection and correction code corresponding to a second data unit including a plurality of first data units, the uncorrectable error generation flag representing whether or not an error that is hard to correct with the first error detection and correction code has occurred, the uncorrectable error generation flag being managed for each second data unit;
a controller configured to prohibit access to the second data unit representing that the error that is hard to correct with the first error detection and correction code has occurred in a case where a command for the access with data change is issued; and
a correction section configured to use the second error detection and correction code to correct the second data unit in a case where the second data unit representing that the error that is hard to correct with the first error detection and correction code has occurred is restored.

(2) The storage control apparatus according to (1) above, in which
the controller is configured to notify a source of a command for write access to the second data unit representing that the error that is hard to correct with the first error detection and correction code has occurred of that write access is prohibited in a case where the command for write access is issued.

(3) The storage control apparatus according to (1) or (2) above, further including
a second error detection and correction code valid flag management section configured to manage a second error detection and correction code valid flag that represents whether or not the second error detection and correction code is valid for each second data unit, the controller being configured to notify, based on the second error detection and correction code valid flag, a source of a command for read access to the second data unit in which the error that is hard to correct with the first error detection and correction code has occurred in a case where the command for read access is issued.

(4) The storage control apparatus according to any one of (1) to (3) above, in which the controller is configured to notify a source of a command for removing the second error detection and correction code of that removal of the second error detection and correction code is prohibited in a case where the command for removing is issued with respect to the second data unit representing that the error that is hard to correct with the first error detection and correction code has occurred.

(5) The storage control apparatus according to any one of (1) to (4) above, further including a temporary alternative area valid flag management section configured to manage, for each second data unit, a temporary alternative area valid flag that represents whether or not there is a temporary alternative area corresponding to at least a part of the second data unit, the controller being configured to perform write access to the temporary alternative area in a case where a command for write access is issued with respect to an area in which the temporary alternative area exists, and to perform read access to the temporary alternative area in a case where a command for read access is issued with respect to the area in which the temporary alternative area exists.

(6) The storage control apparatus according to (5) above, in which the controller is configured to reflect memory content of the temporary alternative area on the memory to regenerate the first error detection and correction code and the second error detection and correction code in a case where a command for eliminating the temporary alternative area is issued.

(7) The storage control apparatus according to any one of (1) to (6), in which the controller is configured to use, when a system is shutdown, the second error detection and correction code to restore the second data unit representing that the error that is hard to correct with the first error detection and correction code has occurred.

(8) The storage control apparatus according to any one of (1) to (7), in which the second data unit further includes additional information corresponding to each of the plurality of first data units.

(9) A storage apparatus, including:

a memory configured to store
a first error detection and correction code corresponding to a first data unit, and
a second error detection and correction code corresponding to a second data unit including a plurality of first data units;

an uncorrectable error generation flag management section configured to manage an uncorrectable error generation flag in the memory, the uncorrectable error generation flag representing whether or not an error that is hard to correct with the first error detection and correction code has occurred, the uncorrectable error generation flag being managed for each second data unit;

a controller configured to prohibit access to the second data unit representing that the error that is hard to correct with the first error detection and correction code has occurred in a case where a command for the access with data change is issued; and a correction section configured to use the second error detection and correction code to correct the second data unit in a case where the second data unit representing that the error that is hard to correct with the first error detection and correction code has occurred is restored.

(10) An information processing system, including:

a memory configured to store
a first error detection and correction code corresponding to a first data unit, and
a second error detection and correction code corresponding to a second data unit including a plurality of first data units;

a host computer configured to issue a command for access to the memory;

an uncorrectable error generation flag management section configured to manage an uncorrectable error generation flag in the memory, the uncorrectable error generation flag representing whether or not an error that is hard to correct with the first error detection and correction code has occurred, the uncorrectable error generation flag being managed for each second data unit;

a controller configured to prohibit access to the second data unit representing that the error that is hard to correct with the first error detection and correction code has occurred in a case where a command for the access with data change is generated; and a correction section configured to use the second error detection and correction code to correct the second data unit in a case where the second data unit representing that the error that is hard to correct with the first error detection and correction code has occurred is restored.

(11) A storage control method, including:

managing an uncorrectable error generation flag in a memory configured to store a first error detection and correction code corresponding to a first data unit, and
a second error detection and correction code corresponding to a second data unit including a plurality of first data units, the uncorrectable error generation flag representing whether or not an error that is hard to correct with the first error detection and correction code has occurred, the uncorrectable error generation flag being managed for each second data unit;

prohibiting access to the second data unit representing that the error that is hard to correct with the first error detection and correction code has occurred in a case where a command for the access with data change is generated; and using the second error detection and correction code to correct the second data unit in a case where the second data unit representing that the error that is hard to correct with the first error detection and correction code has occurred is restored.

It should be understood by those skilled in the art that various modifications, combinations, sub-combinations and alterations may occur depending on design requirements and other factors insofar as they are within the scope of the appended claims or the equivalents thereof.

What is claimed is:

1. A storage control apparatus comprising:
a memory controller configured to write pages of data into memory and read the pages of the data from the memory, a block of the memory includes at least a first one of the pages and a second one of the pages,
wherein the first one of the pages includes first data along with an error detection and correction code for the first data, the second one of the pages includes second data along with an error detection and correction code for the second data,
wherein a third one of the pages includes third data along with an error detection and correction code for the third data, the third data includes an error detection and correction code for the block,
wherein the memory controller is configured to prohibit access to the block when an error in the first data or the second data is uncorrectable, and
wherein the third one of the pages includes an uncorrectable error generation flag, the uncorrectable error generation flag indicates that the error in the first data or the second data is correctable or uncorrectable.

2. The storage control apparatus according to claim 1, wherein the memory controller is configured to write the third data to the third one of the pages after the first data has been written to the first one of the pages.

3. The storage control apparatus according to claim 2, wherein the memory controller is configured to write the third data to the third one of the pages after the second data has been written to the second one of the pages.

4. The storage control apparatus according to claim 1, wherein the memory controller is configured to use the error detection and correction code for the third data in an attempt to correct an error in the third data.

5. The storage control apparatus according to claim 4, wherein the memory controller is configured to use either the error detection and correction code for the first data or the error detection and correction code for the second data in the attempt to correct the error in the third data.

6. The storage control apparatus according to claim 1, wherein the memory controller is configured to write the first data and the error detection and correction code for the first data to the first one of the pages simultaneously.

7. The storage control apparatus according to claim 1, wherein the memory controller is configured to prohibit access to the block when the uncorrectable error generation flag indicates that the error in the first data or the second data is uncorrectable.

8. An information processing system comprising:
the storage control apparatus according to claim 1; and
a host computer configured to issue a command to the storage control apparatus for access to the memory, the storage control apparatus is configured to issue a command to the host computer when the error in the first data or the second data is uncorrectable.

9. The information processing system according to claim 8, wherein the host computer is configured to attempts to eliminate the error in the first data or the second data upon receiving the command to the host computer.

10. A storage apparatus comprising:
the storage control apparatus according to claim 1; and
the memory that is configured to store the pages of the data.

11. A storage control method comprising:
writing pages of data into memory and reading the pages of the data from the memory, a block of the memory includes at least a first one of the pages and a second one of the pages;
prohibiting access to the block when an error in first data or second data is uncorrectable;
issuing a command to a storage control apparatus for access to the memory; and
issuing a command from the storage control apparatus when the error in the first data or the second data is uncorrectable,
wherein the first one of the pages includes the first data along with an error detection and correction code for the first data, the second one of the pages includes the second data along with an error detection and correction code for the second data, and
wherein a third one of the pages includes third data along with an error detection and correction code for the third data, the third data includes an error detection and correction code for the block.

12. The storage control method according to claim 11, wherein the third one of the pages includes an uncorrectable error generation flag, the uncorrectable error generation flag indicates that the error in the first data or the second data is correctable or uncorrectable.

13. The storage control method according to claim 12, further comprising:
prohibiting access to the block when the uncorrectable error generation flag indicates that the error in the first data or the second data is uncorrectable.

14. The storage control method according to claim 11, further comprising:
writing the third data to the third one of the pages after the first data has been written to the first one of the pages.

15. The storage control method according to claim 14, wherein the third data is written to the third one of the pages after the second data has been written to the second one of the pages.

16. The storage control method according to claim 11, further comprising:
attempting to correct an error in the third data, the error detection and correction code for the third data is used during an attempt to correct an error in the third data.

17. The storage control method according to claim 16, wherein either the error detection and correction code for the first data or the error detection and correction code for the second data is used in the attempt to correct the error in the third data.

18. The storage control method according to claim 11, wherein the first data and the error detection and correction code for the first data to the first one of the pages are written simultaneously.

* * * * *